(12) United States Patent
Takahashi

(10) Patent No.: US 10,998,363 B2
(45) Date of Patent: May 4, 2021

(54) SOLID-STATE IMAGING DEVICE AND METHOD OF PRODUCING SOLID-STATE IMAGING DEVICE

(71) Applicant: TOPPAN PRINTING CO., LTD., Taito-ku (JP)

(72) Inventor: Satoshi Takahashi, Taito-ku (JP)

(73) Assignee: TOPPAN PRINTING CO., LTD., Taito-ku (JP)

(*) Notice: Subject to any disclaimer, the term of this patent is extended or adjusted under 35 U.S.C. 154(b) by 26 days.

(21) Appl. No.: 16/655,357

(22) Filed: Oct. 17, 2019

(65) Prior Publication Data

US 2020/0052021 A1    Feb. 13, 2020

Related U.S. Application Data

(63) Continuation of application No. PCT/JP2018/015907, filed on Apr. 17, 2018.

(30) Foreign Application Priority Data

Apr. 18, 2017 (JP) .............................. JP2017-082309

(51) Int. Cl.
  *H01L 27/146* (2006.01)
  *H01L 21/3065* (2006.01)

(52) U.S. Cl.
  CPC .... *H01L 27/14621* (2013.01); *H01L 21/3065* (2013.01); *H01L 27/14685* (2013.01)

(58) Field of Classification Search
  CPC ........... H01L 27/14621; H01L 21/3065; H01L 27/14685
  See application file for complete search history.

(56) References Cited

U.S. PATENT DOCUMENTS

2005/0116271 A1* 6/2005 Kato ................. H01L 27/14658
                                                               257/292
2006/0115230 A1* 6/2006 Komoguchi ...... H01L 27/14601
                                                               385/146

(Continued)

FOREIGN PATENT DOCUMENTS

JP    11-68076 A    3/1999
JP    490760 B2     3/2012

OTHER PUBLICATIONS

International Search Report dated Jul. 3, 2018 in PCT/JP2018/015907, filed Apr. 17, 2018 (with English Translation).

(Continued)

*Primary Examiner* — Errol V Fernandes
(74) *Attorney, Agent, or Firm* — Oblon, McClelland, Maier & Neustadt, L.L.P.

(57) ABSTRACT

A solid-state imaging device including a semiconductor substrate including photoelectric conversion elements, and having color filters of plural colors formed on the semiconductor substrate and positioned in correspondence to the photoelectric conversion elements, a first visible-light transmissive layer formed between the semiconductor substrate and the color filters, and second visible-light transmissive layers each formed between adjacent color filters. The second visible-light transmissive layers include a same material as the first visible-light transmissive layer and are continuous with the first visible-light transmissive layer. The color filters having a largest area among the color filters of the plural colors each have an edge portion being continuous with an edge portion of a corresponding one of the second visible-light transmissive layers, and the color filters having the largest area each have a side wall on which a reaction product layer including a material forming the first visible-light transmissive layer is formed.

20 Claims, 12 Drawing Sheets

(56) References Cited

U.S. PATENT DOCUMENTS

| | | |
|---|---|---|
| 2009/0090850 A1 | 4/2009 | Liu et al. |
| 2010/0155582 A1* | 6/2010 | Hirano .............. H01L 27/14621 250/227.11 |
| 2011/0049665 A1* | 3/2011 | Goto .................... H01L 27/307 257/459 |
| 2012/0161270 A1* | 6/2012 | Maehara ............... H01L 27/307 257/432 |
| 2013/0056617 A1 | 3/2013 | Massetti |
| 2016/0307942 A1 | 10/2016 | Cheng et al. |

OTHER PUBLICATIONS

Extended European Search Report dated Mar. 18, 2020 in European Patent Application No. 18788212.1, 6 pages.

* cited by examiner

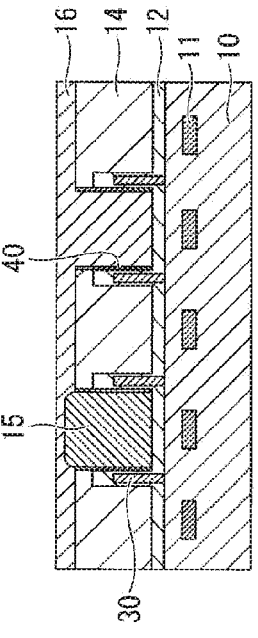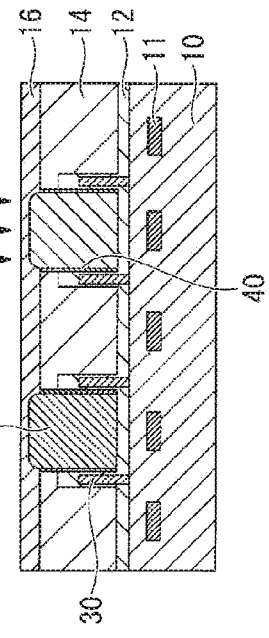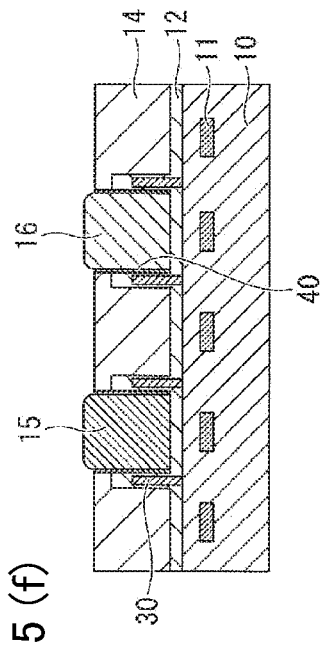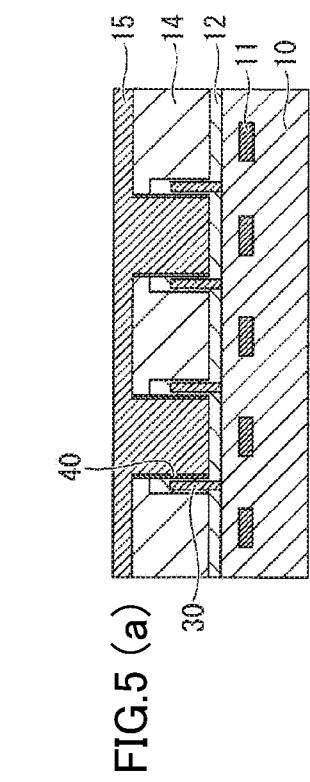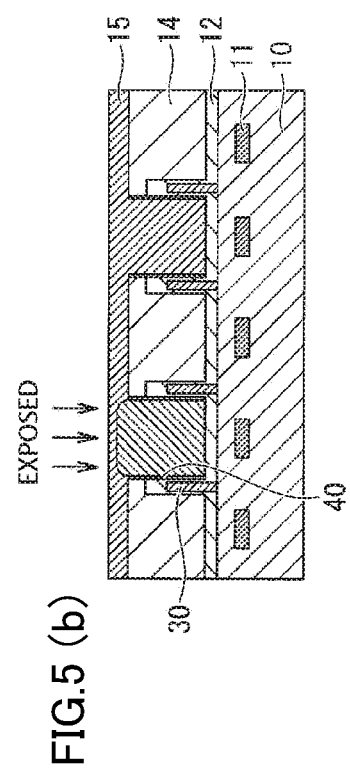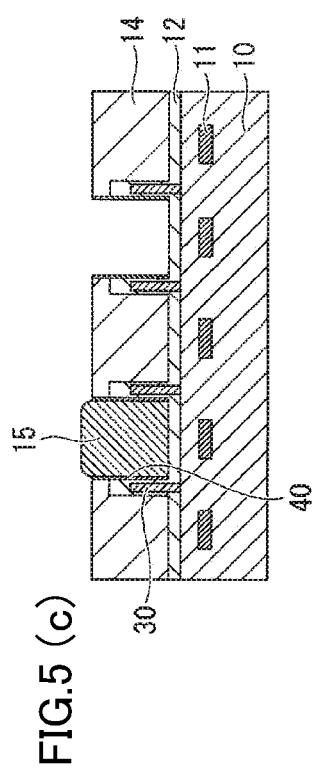

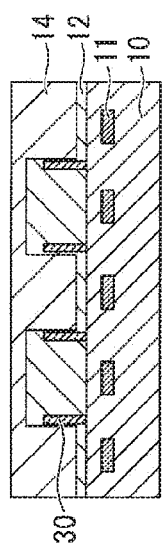
FIG.9 (a)
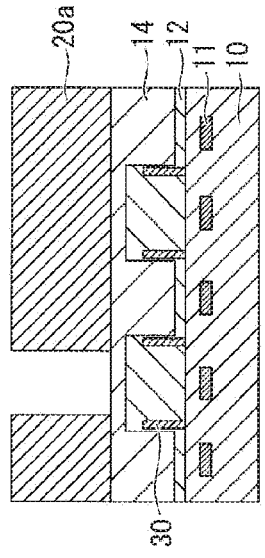
FIG.9 (b)
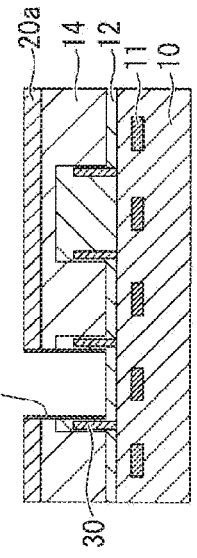
FIG.9 (c)
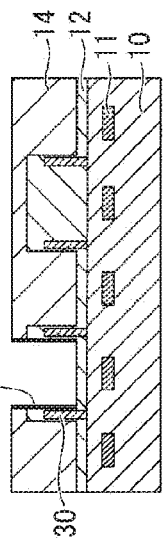
FIG.9 (d)
FIG.9 (e)
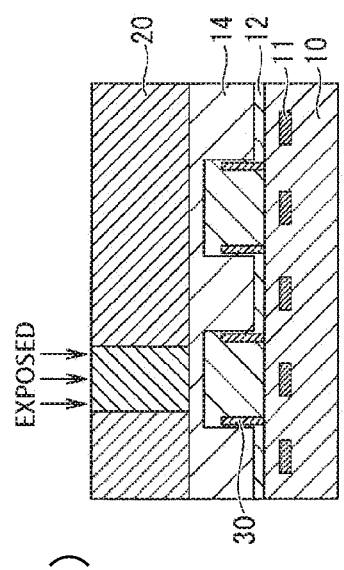
FIG.9 (f)

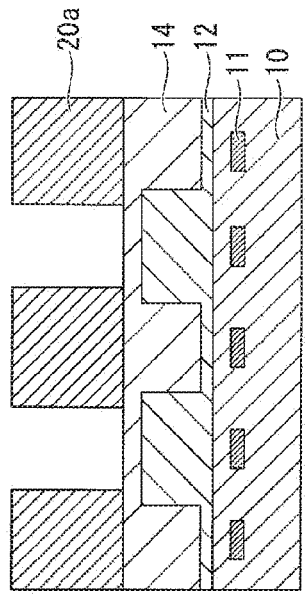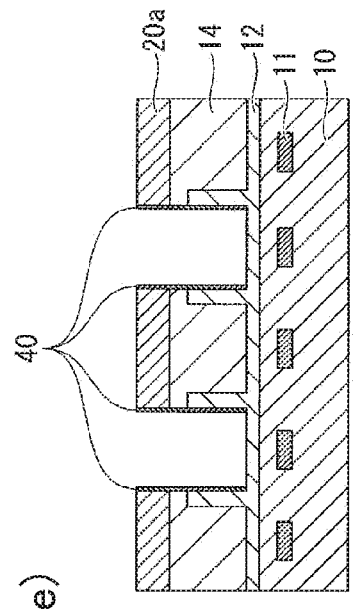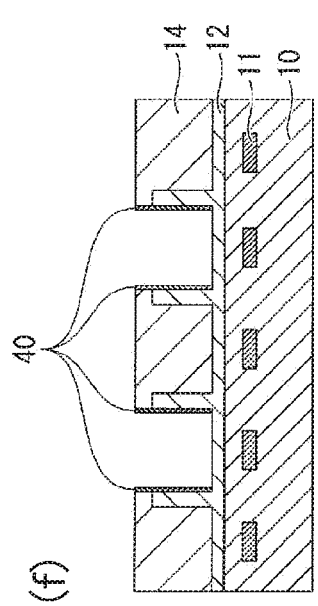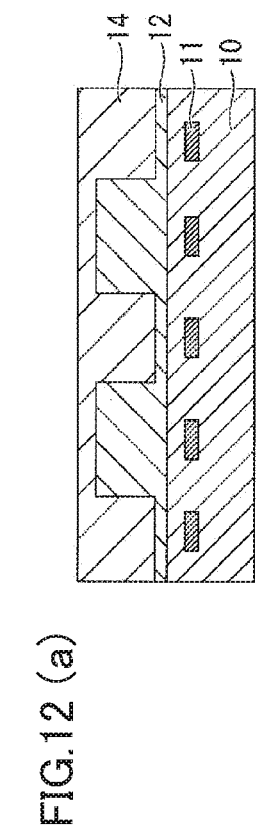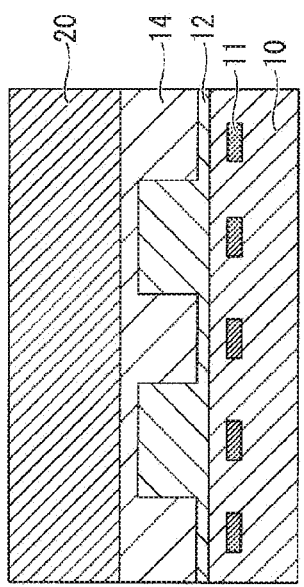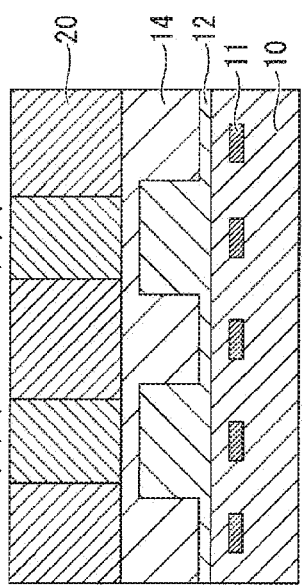

SOLID-STATE IMAGING DEVICE AND METHOD OF PRODUCING SOLID-STATE IMAGING DEVICE

CROSS-REFERENCE TO RELATED APPLICATIONS

The present application is a continuation of International Application No. PCT/JP2018/015907, filed Apr. 17, 2018, which is based upon and claims the benefits of priority to Japanese Application No. 2017-082309, filed Apr. 18, 2017. The entire contents of all of the above applications are incorporated herein by reference.

BACKGROUND OF THE INVENTION

Field of the Invention

The present invention relates to a solid-state imaging device and a method of producing a solid-state imaging device.

Discussion of the Background

Techniques relating to solid-state imaging devices and methods of producing the same are described, for example, in PTLs 1 or 2.
PTL1: JP H11-68076 A
PTL2: JP 4905760 B

SUMMARY OF THE INVENTION

According to an aspect of the present invention, a solid-state imaging device includes a semiconductor substrate including two-dimensionally positioned photoelectric conversion elements, and having color filters of plural colors formed on the semiconductor substrate and positioned in correspondence to the photoelectric conversion elements, a first visible-light transmissive layer formed between the semiconductor substrate and the color filters, and second visible-light transmissive layers each formed between adjacent color filters. The second visible-light transmissive layers include a same material as the first visible-light transmissive layer and are continuous with the first visible-light transmissive layer. The color filters having a largest area among the color filters of the plural colors each have an edge portion being continuous with an edge portion of a corresponding one of the second visible-light transmissive layers, and the color filters having the largest area each have a side wall on which a reaction product layer including a material forming the first visible-light transmissive layer is formed.

According to another aspect of the present invention, a method of producing a solid-state imaging device includes forming a visible-light transmissive layer on a semiconductor substrate which includes two-dimensionally positioned photoelectric conversion elements, and has color filters of plural colors formed on the semiconductor substrate and positioned in correspondence to the photoelectric conversion elements, dry etching the visible-light transmissive layer such that the visible-light transmissive layer is patterned with openings formed at positions where first-color color filters among the color filters are to be formed, applying a first-color color filter material to the visible-light transmissive layer such that the openings are filled with the first-color color filter material, curing the first-color color filter material such that first-color color filters are formed on the visible-light transmissive layer, dry etching the visible-light transmissive layer and the first-color color filters such that openings are formed at positions where other color filters are to be formed, and forming the other color filters by photolithographic patterning.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2(a) and 2(b) are diagrams each illustrating a partial cross-sectional view of a color filter array according to the first embodiment of the present invention, in which FIG. 2(a) is a cross-sectional view taken along the line A-A' of FIG. 1, and FIG. 2(b) is a cross-sectional view taken along the line B-B' of FIG. 1.

FIGS. 5(a)-5(f) are cross-sectional views sequentially illustrating steps of preparing second and third color filter patterns by photolithography, according to the first embodiment of the present invention.

FIGS. 9(a)-9(f) are cross-sectional views sequentially illustrating steps of preparing second and third color filter patterns by forming openings in the barrier layer by dry etching, followed by coating and drying, according to the first embodiment of the present invention.

FIGS. 12(a)-12(f) are cross-sectional views sequentially illustrating steps of preparing first color filter patterns, according to the second embodiment of the present invention.

DESCRIPTION OF THE EMBODIMENTS

Figure 1:
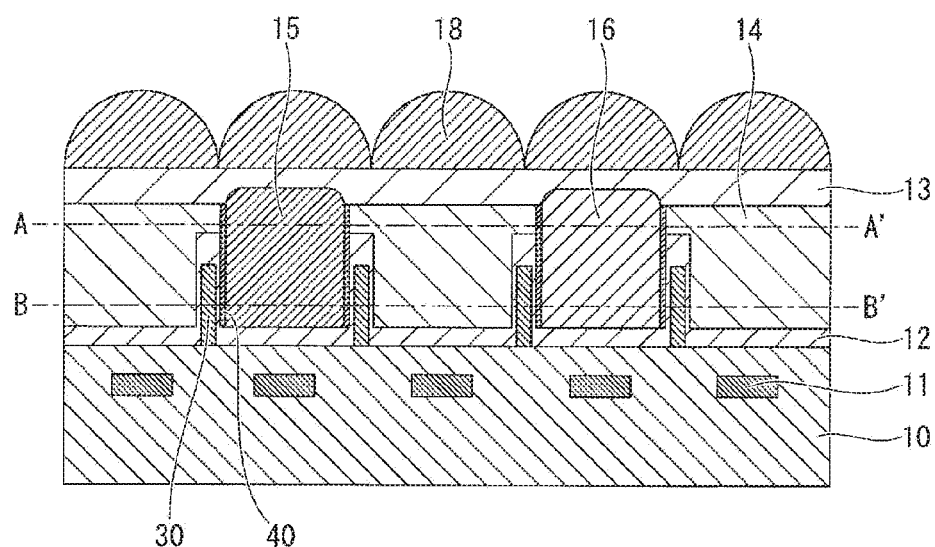
FIG. 1 is a cross-sectional view illustrating a solid-state imaging device according to a first embodiment of the present invention.

The embodiments will now be described with reference to the accompanying drawings, wherein like reference numerals designate corresponding or identical elements throughout the various drawings.

With reference to the drawings, some embodiments of the present invention will be described.

1. First Embodiment (1-1) Configuration of Solid-State Imaging Device

As shown in FIG. 1, a solid-state imaging device according to a first embodiment of the present invention includes a semiconductor substrate 10 including a plurality of two-dimensionally arranged photoelectric conversion elements 11, a plurality of microlenses 18 arranged above the semiconductor substrate 10, and color filters 14, 15 and 16 for a plurality of colors provided between the semiconductor substrate 10 and the microlenses 18. The color filters 14, 15 and 16 for a plurality of colors are arranged facing the respective photoelectric conversion elements 11.

The solid-state imaging device of the first embodiment is provided with a surface protective layer and a barrier layer 12 which transmit visible light and which are integrally formed on the surface of the semiconductor substrate 10, and a planarizing overlayer 13 provided on the upper surfaces of the color filters 14, 15 and 16. The solid-state imaging device of the first embodiment includes metal-containing barrier layers 30 in the visible-light transmissive barrier layer 12. The barrier layers 30 are in a lattice form and define the color filters 14, 15 and 16.

In the following description of the solid-state imaging device of the first embodiment, the color filters 14 formed first in the production process are defined as first color filters. The color filters 15 formed second in the production process are defined as second color filters, and the color filters 16 formed third in the production process are defined as third color filters. The present embodiment will be described assuming that the color filters 14 formed first have a largest area.

It is preferable that reaction product layers 40 produced as a result of etching the visible-light transmissive layer are formed respectively covering the side walls of the color filters having a largest area.

Components of the solid-state imaging device will be described in detail below.

(Photoelectric Conversion Elements and Semiconductor Substrate)

The photoelectric conversion elements 11 convert light into an electrical signal.

The semiconductor substrate 10, in which the photoelectric conversion elements 11 are formed, generally has an outermost surface covered with a protective film for the purpose of protecting and planarizing the surface. The semiconductor substrate 10 is made of a material that transmits visible light and can withstand a temperature of at least about 300° C. Examples of such a material include Si-containing materials, including Si, an oxide such as $SiO_2$, a nitride such as SiN, and a mixture thereof.

(Microlenses)

The microlenses 18 are arranged above the semiconductor substrate 10 so as to be provided for the respective photoelectric conversion elements 11 which are two-dimensionally arranged in the semiconductor substrate 10. Each of the microlenses 18 can compensate for sensitivity reduction of the corresponding one of the photoelectric conversion elements 11 by collecting light incident on the microlens 18 to the photoelectric conversion element 11.

(Surface Protective Layer and Barrier Layer which Transmit Visible Light)

The surface protective layer and the barrier layer 12 which transmit visible light (hereinafter, also simply termed a barrier layer 12) is provided as a barrier for surface protection and planarization of the semiconductor substrate 10 and for color mixing prevention. In the barrier layer 12, the surface protective layer reduces asperities of the upper surface of the semiconductor substrate 10 due to fabrication of the photoelectric conversion elements 11, and reduces color mixing to improve sensitivity.

Any material, such as $SiO_2$, ITO, $SnO_2$, or ZnO, may be used for the barrier layer 12 as long as the material transmits visible light having a wavelength in the range of 400 nm to 700 nm and does not inhibit pattern formation or adhesion of the color filters 14, 15 and 16. The material is preferably a material that is easily dry-etched, and more preferably $SiO_2$.

(Planarizing Overlayer)

The planarizing overlayer 13 is provided to planarize the upper surfaces of the color filters 14, 15 and 16.

For example, the planarizing overlayer 13 is made of one or more resins, including an acrylic resin, an epoxy resin, a polyimide resin, a phenol novolak resin, a polyester resin, a urethane resin, a melamine resin, a urea resin and a styrene resin. The planarizing overlayer 13 may be integrated with the microlenses 18.

(Color Filters)

The color filters 14, 15 and 16 correspond to respective colors and are used for color separation of incident light. The color filters 14, 15 and 16 are provided between the semiconductor substrate 10 and the microlenses 18, and arranged in a predetermined regular pattern so as to face respective elements of the plurality of photoelectric conversion elements 11.

Figure 2:
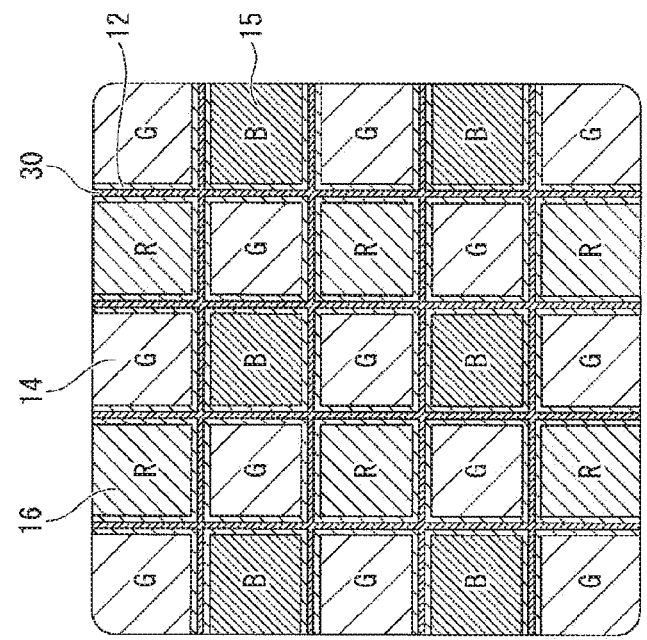
Figure 2:
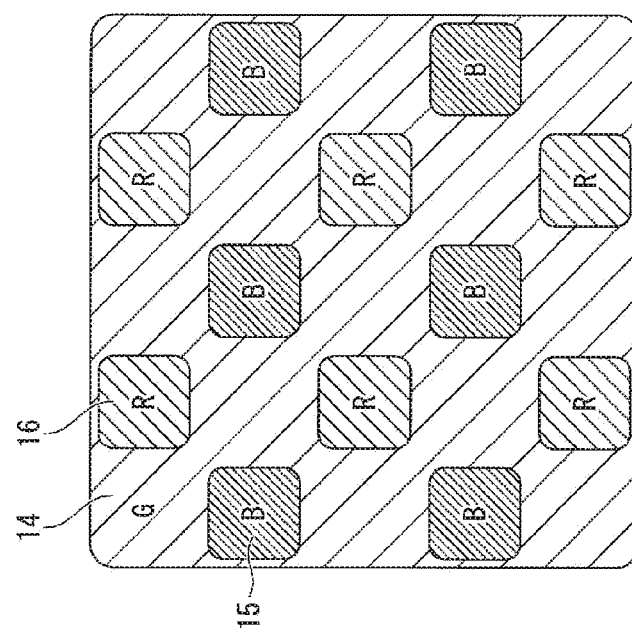
Figure 3:
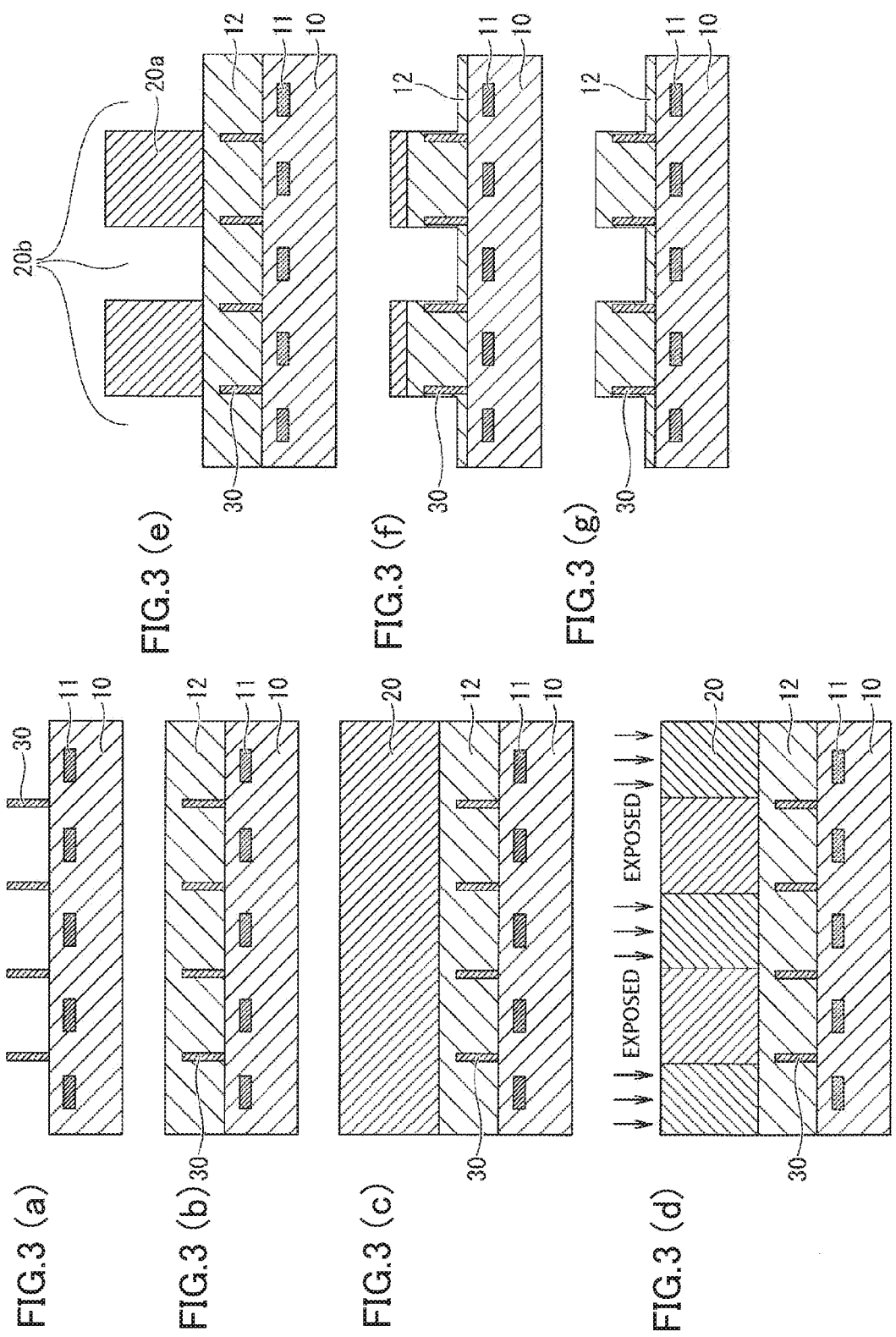
FIGS. 3(a)-3(g) are cross-sectional views sequentially illustrating steps of forming a surface protective layer and a barrier layer which transmit visible light and forming openings by dry etching using a photosensitive resin pattern material at portions where first color filters are to be formed, according to the first embodiment of the present invention.
Figure 4:
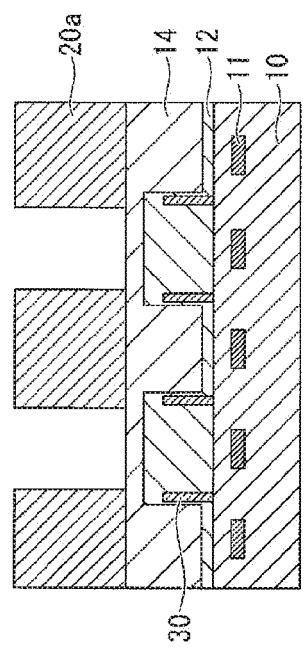
FIGS. 4(a)-4(f) are cross-sectional views sequentially illustrating steps of applying and curing first color filter patterns, and forming openings by dry etching using a photosensitive resin pattern material at portions where second and the subsequent color filters are to be formed, according to the first embodiment of the present invention including.
Figure 4:
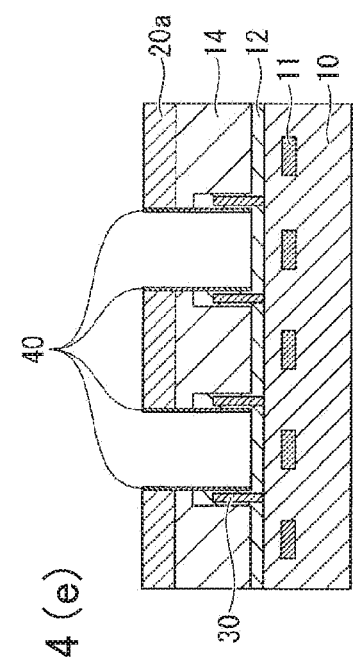
Figure 4:
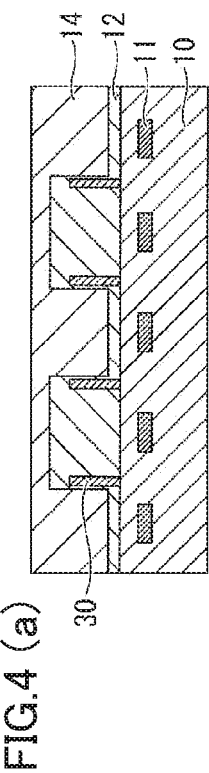
Figure 4:
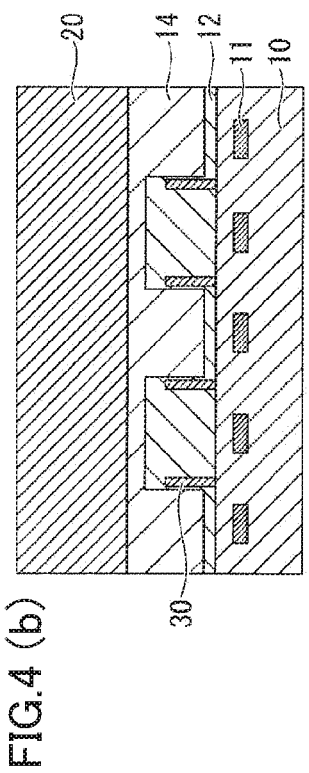
Figure 4:
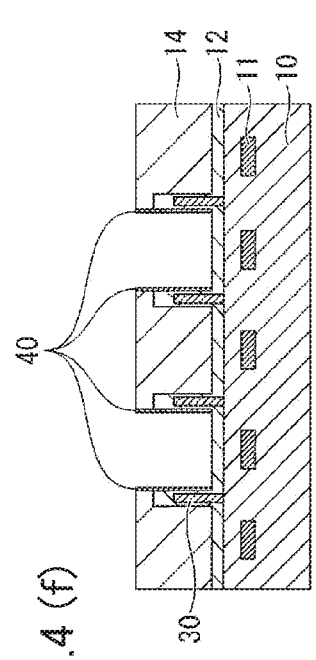
Figure 4:
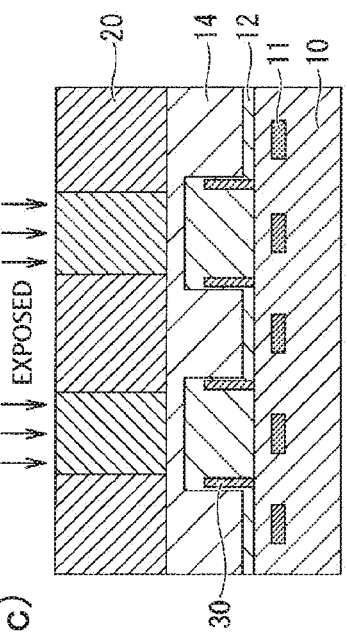

FIGS. 2(a) and 2(b) are plan views each illustrating an array of the color filters 14, 15 and 16. The array shown in FIGS. 2(a) and 2(b) is a Bayer array. FIG. 2(a) is a cross-sectional plan view taken along the line A-A' of FIG. 1, not including the metal-containing lattice barrier layers 30. FIG. 2(b) is a cross-sectional plan view taken along the line B-B' of FIG. 1, including the metal-containing lattice barrier layers 30.

The color filters 14, 15 and 16 each contain a pigment of a predetermined color and a thermosetting component or a photocurable component. For example, the color filters 14 contain a green pigment, the color filters 15 contain a blue pigment, and the color filters 16 contain a red pigment.

The present embodiment will be described by way of the solid-state imaging device including the Bayer-array color filters shown in FIGS. 2(a) and 2(b). However, the color filter array of the solid-state imaging device is not necessarily limited to a Bayer array, and colors of the color filters are not limited to the three RGB colors. For example, part of the array of green filters having a larger area in the Bayer array may be replaced with transparent filters whose refractive index is adjusted by a visible-light transmissive material, or with transparent filters containing a material that cuts off IR light.

(1-2) Method of Producing Solid-State Imaging Device

Referring to FIGS. 3(a)-6(b), a method of producing a solid-state imaging device according to the first embodiment of the present invention will be described.

(Forming Metal Barriers in Surface Protective Layer and Barrier Layer which Transmit Visible Light)

As shown in FIG. 3(a), a semiconductor substrate 10 having a plurality of two-dimensionally arranged photoelectric conversion elements 11 is prepared, and metal-containing lattice barrier layers 30 are formed on a surface of the substrate 10 such that the barrier layers 30 are located at the respective photoelectric conversion elements 11 and between the color filter forming portions. To prevent entry of light that has passed through a color filter into an adjacent photoelectric conversion element 11, the metal-containing lattice barrier layers 30 are made, for example, of one or more metallic materials such as Al, W, Ti, Cu and Ag, or made of a compound such as an oxide compound or a nitride compound of these metals.

The metal-containing lattice barrier layers 30 may be formed using a known method. For example, the metal-containing lattice barrier layers 30 may be formed by firstly forming a metal layer on the semiconductor substrate 10, forming a mask pattern on the metal layer for use as an etching mask at the time of photolithography, and forming lattice metal barrier layers by etching. Alternatively, the metal-containing lattice barrier layers 30 may be formed by forming a mask pattern on a semiconductor substrate by photolithography, followed by forming a metal layer using any film formation method such as vapor deposition, sputtering, or CVD, and patterning the meta layer into a desired lattice form using lift-off. The lattice form is established such that cells of the lattice surround the individual photoelectric conversion elements 11.

The metal-containing lattice barrier layers 30 may each preferably have a thickness (height) in the range of about 100 nm or more and 500 nm or less. When the thickness (height) of each metal-containing lattice barrier layer 30 is larger than the thickness of each color filter, more light is absorbed or reflected by the metal-containing lattice barrier layers 30. Thus, the thickness of each metal-containing lattice barrier layer 30 is preferably not more than that of each color filter. The width of each wall of the lattice is preferably about 100 nm or less. As the width increases, the area of the metal-containing lattice barrier layers 30 increases, and entry of light into the photoelectric conversion elements 11 is blocked. Therefore, if color mixing of obliquely entering light can be reduced, the lattice preferably has thin walls.

Then, as shown in FIG. 3(b), a visible-light transmissive barrier layer 12 is formed on the semiconductor substrate 10 so as to cover the metal-containing lattice barrier layers 30. Although the method of forming a barrier layer 12 depends on the material composition to be used, it may be formed, for example, by a well-known film formation method such as vapor deposition, sputtering or CVD. In the case such as of forming a layer containing $SiO_2$, a simple method may be used, such as of applying a coating liquid containing $SiO_2$ by SOG (spin on glass) and heating and curing the coating liquid. Through these film formation methods, a visible-light transmissive barrier layer 12 including metal-containing lattice barrier layers 30 inside is formed on the semiconductor substrate 10.

The barrier layer 12 is formed with a thickness larger than that of each metal-containing lattice barrier layer 30. In the present embodiment, the thickness is preferably in the range of about 150 nm or more and 700 nm or less. If the thickness of the barrier layer 12 is larger than that of each of the color filters 14, 15 and 16, light transmitted through the barrier layer 12 from above may enter the photoelectric conversion elements 11. Therefore, the thickness of the barrier layer 12 is preferably smaller than that of each of the color filters 14, 15 and 16, and preferably, for example, about 400 nm or less.

(Forming Openings at Portions where First Color Filters are to be Formed)

Referring to FIGS. 3(c) to 3(g), the following description explains processes of forming openings at portions of the barrier layer 12 formed on the semiconductor substrate 10, for forming first color filters 14. As described above, in the present embodiment, it is assumed that first color filters 14 occupy a largest area in the solid-state imaging device.

(Forming Etching Mask Pattern)

As shown in FIGS. 3(c) to 3(g), an etching mask pattern having openings is formed on the barrier layer 12 that has been formed previously.

First, as shown in FIG. 3(c), a photosensitive resin mask material is applied onto the barrier layer 12 and dried to form an etching mask 20 formed of a photosensitive resin layer.

Then, as shown in FIG. 3(d), the etching mask 20 is exposed using a photomask (not shown) to cause a chemical reaction with which the etching mask 20 is made soluble in a developing solution, leaving a required pattern.

Then, as shown in FIG. 3(e), unwanted portions (exposed portions) of the etching mask 20 are removed by development. Thus, there is formed a photosensitive resin mask layer 20a as an etching mask pattern having openings 20b. In the openings 20b, first color filters 14 are respectively formed in a process described later.

As the photosensitive resin mask material forming the etching mask 20, for example, an acrylic resin, an epoxy resin, a polyimide resin, a phenol novolak resin, or other photosensitive resins may be used. These materials can be used singly or in combination or copolymerization of two or more. The exposure machine used for photolithography when patterning the etching mask 20 may, for example, be a scanner, a stepper, an aligner, a mirror projection aligner, or the like. The etching mask 20 may be exposed by direct drawing using an electron beam, drawing using a laser, or the like. Among them, a stepper or a scanner is generally used for forming first color filters 14, which need to be finely formed, in the solid-state imaging device.

To produce patterns with high resolution and high precision, the photosensitive resin mask material is preferably a generally used photoresist. Unlike when the patterns are formed of a photosensitive color filter material, use of such a photoresist enables formation of patterns, whose shape is easily controllable, with high dimensional accuracy.

The photoresist used in this case preferably has high dry etching resistance. When the photoresist is used as an etching mask material for use in dry etching, development of the photoresist is very often followed by thermal curing, called post baking to improve a selection ratio that is an etching rate of the etching mask material to a material to be etched. If the process includes thermal curing, however, it may be difficult to remove the residual resist used as the etching mask, after dry etching. Accordingly, the photoresist preferably has a good selection ratio to the material to be etched even when thermal curing is not used. When the photoresist does not have a good selection ratio, the photoresist material needs to be formed with a large thickness which however may make it difficult to form fine patterns. Thus, the photoresist is preferably a material having high dry etching resistance.

Specifically, an etching rate ratio (selection ratio) of a photosensitive resin mask material as a material of the etching mask 20 to a first color filter material to be dry-etched is preferably 0.5 or more, and more preferably 0.8 or more. With the above selection ratio, the barrier layer 12 can be etched without completely removing the photosensitive resin mask layer 20a. When the barrier layer 12 has a thickness of about 0.2 μm or more and 0.8 μm or less, the photosensitive resin mask layer 20a desirably has a thickness of about 0.5 μm or more and 2.0 μm or less.

The photoresist used in this case may be a positive resist or a negative resist. However, considering removal of the photoresist after etching, a positive resist is more preferable than a negative resist. This is because, due to external factors, a chemical reaction of dissolving the resist is likely to occur in the positive resist, while a chemical reaction of curing the resist occurs in the negative resist.

Through the processes set forth above, an etching mask pattern is formed.

(Dry Etching)

As shown in FIG. 3(f), portions of the surface protective layer and the barrier layer 12 which transmit visible light exposed from the openings 20b are removed by dry etching using the photosensitive resin mask layer 20a and a dry etching gas.

Examples of the dry etching include using ECR (electron cyclotron resonance), parallel plate magnetron, DRM, ICP (inductively coupled plasma), and dual frequency type RIE (reactive ion etching). The etching method is not particularly limited, but may preferably be a method enabling control, with an etching rate or an etched shape remaining unchanged, even for patterns with different line widths or areas, such as large-area patterns each having a width of several millimeters or more, or minute patterns each having a width of a several hundred nanometers. A dry etching method to be used may preferably have a control mechanism enabling uniform in-plane dry etching across a surface of a wafer with a size of about 100 mm to 450 mm.

The dry etching gas may be a gas having reactivity (oxidization and reduction), or may be a gas having etching properties. For example, the gas having reactivity may be a gas containing fluorine, oxygen, bromine, sulfur, chlorine or the like. Furthermore, noble gases containing an element, such as argon or helium, having low reactivity and enabling etching by physical impact of ions, can be used singly or mixed. When performing dry etching under a plasma environment using a gas, the gas is not necessarily limited to gases mentioned above but may be, for example, hydrogen gas or nitrogen gas, as long as the gas causes a reaction forming a desired pattern.

It is necessary to change the etching gas depending on the material of the barrier layer 12. However, when using $SiO_2$, which is preferable in the present embodiment, the material is etched using a fluorine-based gas, an oxygen-based gas, or a mixture thereof as an etching gas. The material may preferably be etched by mixing a noble gas into the etching gas, for control of the etching rate and for processing with high verticality. When a material such as ITO is used as a material for the barrier layer 12, the material may preferably be etched by mixing a gas such as chlorine, methane or hydrogen.

Under any etching conditions, the semiconductor substrate 10 resides under the barrier layer 12, and therefore the conditions may preferably satisfy the requirement that the barrier layer 12 be etched and the semiconductor substrate 10 not be etched.

Since the barrier layer 12 is made of a material that transmits visible light, it is preferable that the barrier layer 12 is left under portions where the first color filters 14 are formed. Specifically, the barrier layer 12 may preferably be dry-etched stepwise. For example, after etching about 90% of the thickness of the barrier layer 12, the reactive gas flow rate may preferably be reduced to decrease the etching rate, and the etching may be stopped after 95% or more and less than 100% of the thickness of the barrier layer 12 has been etched.

As shown in FIG. 3(f), after dry-etching the barrier layer 12 under the above-described conditions until the etching reaches or approaches the surface of the semiconductor substrate 10, the photosensitive resin mask layer 20a may be removed to provide openings at portions in which the first color filter patterns are to be formed.

Depending on the material of the barrier layer 12, the surface flatness may be poor. In this case, dry etching may be combined with wet etching. Specifically, for example, after dry etching 80% or more of the thickness of the barrier layer 12, the remaining layer may be wet-etched. However, since wet etching proceeds isotropically, it is preferable that the etching-damaged outermost surface is finally subjected to dry etching which is well controllable and anisotropically performed.

Then, as shown in FIG. 3(g), the remaining photosensitive resin mask layer 20a is removed. As the method of removing the photosensitive resin mask layer 20a, for example, a method of dissolving/separating the photosensitive resin mask layer 20a using a chemical solution or a solvent may be used. Examples of the solution for removing the photosensitive resin mask layer 20a include organic solvents, such as N-methyl-2-pyrolidone, cyclohexanone, diethylene glycol monomethyl ether acetate, methyl lactate, butyl lactate, dimethyl sulfoxide, diethylene glycol diethyl ether, propylene glycol monomethyl ether, propylene glycol monoethyl ether, and propylene glycol monomethyl ether acetate. These organic solvents may be used singly or in combination of two or more. The solvent used in this case may preferably be a solvent that does not affect the color filter material. As long as the color filter material is not affected, a separation method using an acidic chemical agent may be used.

The photosensitive resin mask layer 20a may be removed by methods other than the wet process using solutions or the like mentioned above. For example, the photosensitive resin mask layer 20a may be removed by using an ashing technique for resists, which uses photoexcitation or oxygen plasma. These methods may be used in combination. For example, an ashing method by photoexcitation or oxygen plasma may be used first to remove the surface layer that has been altered by dry-etching the surface of the photosensitive resin mask layer 20a, followed by removing the remaining layer by wet etching using a solvent or the like. Further, as long as the semiconductor substrate 10 and the barrier layer 12 are not damaged, the photosensitive resin mask layer 20a may be removed by only ashing. Not only the dry process such as ashing but also, for example, CMP (chemical mechanical polishing) or the like may be used.

Removal of the photosensitive resin mask layer 20a using these methods completes a configuration in which the metal-containing lattice barrier layers 30 are formed on the semiconductor substrate 10, and the surface protective layer and the barrier layer 12 which transmit visible light are formed covering the metal-containing lattice barrier layers 30, with portions of the barrier layer 12 being etched away to provide openings for forming the first color filters.

(Forming First Color Filters (First Process))

First, referring to FIGS. 4(a)-4(f), a process of forming first color filters 14 on a surface of the barrier layer 12 formed on the semiconductor substrate 10 will be described.

As shown in FIG. 4(a), a first color filter material is applied to a surface of the barrier layer 12 formed on the semiconductor substrate 10 in which the plurality of photoelectric conversion elements 11 are two-dimensionally arranged to thereby form first color filters 14. The first color filter material comprises a first resin dispersion whose main component is a resin material and in which a first pigment (colorant) is dispersed. As shown in FIGS. 2(a) and 2(b), the solid-state imaging device of the present embodiment is assumed to use color filters arranged in a Bayer array. Thus, the first color is preferably green (G).

The resin material of the first color filter material is a mixed resin containing a thermosetting resin such as an epoxy resin and a photocurable resin such as an ultraviolet curable resin. In the mixed resin, the content of the photocurable resin may preferably be lower than that of the thermosetting resin. Unlike when a photocurable resin is mainly used as a curable resin, the main use of a thermosetting resin as a resin material can increase the content of pigment in the layer for first color filters 14. Thus, the first color filters 14 as formed will each have a small thickness and desired spectral characteristics.

The present embodiment describes the case of using a mixed resin containing both the thermosetting resin and the photocurable resin. However, the resin material is not necessarily limited to a mixed resin, but may be a material containing either one of the curable resins.

The layer for first color filters 14 preferably has a thickness in the range of about 400 nm to 800 nm. In the present embodiment, the first color filters may preferably be filters in which the content of the coloring component is difficult to increase using a conventional photosensitive color resist. Specifically, such color filters correspond to green filters in the Bayer array.

Then, ultraviolet light is irradiated onto the entire surface of the layer for first color filters 14 for photocuring. Unlike the case where a color filter material is imparted with photosensitivity and exposed to directly form desired patterns as in the conventional art, the layer for first color filters 14 of the present embodiment is cured across the entirety of the surface thereof. Therefore, the layer for first color filters 14 can be cured even when the content of the photosensitive component is reduced. Irradiation of ultraviolet light may be omitted but may be performed in the following heating and curing process.

Next, the layer for first color filters 14 is heated and cured at 200° C. or more and 300° C. or less. More specifically, the layer for first color filters 14 is preferably heated at a temperature of 230° C. or more and 270° C. or less. When producing solid-state imaging devices, high temperature heating at 200° C. or more and 300° C. or less is very often used for forming microlenses 18. Accordingly, the first color filter material preferably has high-temperature tolerance. Thus, it is more preferable to use a thermosetting resin having high-temperature tolerance as a resin material.

(Forming Etching Mask Pattern)

Then, as shown in FIGS. 4(b) to 4(f), an etching mask pattern having openings is formed on the layer of first color filters 14 and the barrier layer 12 formed in the previous processes.

First, as shown in FIG. 4(b), a photosensitive resin mask material is applied to the surface of the layer for first color filters 14 and dried to form an etching mask 20.

Then, as shown in FIG. 4(c), the etching mask 20 is exposed using a photomask (not shown) to cause a chemical reaction with which the etching mask 20 is made soluble in a developing solution, leaving a required pattern.

Then, as shown in FIG. 4(d), unwanted portions (exposed portions) of the etching mask 20 are removed by development. In this way, a photosensitive resin mask layer 20a having openings is formed. At the positions of the openings, second color filters 15 or third color filters 16 are formed in a later process.

(Forming Openings at Portions where Second and Subsequent Color Filters are to be Formed)

As shown in FIG. 4(e), portions of the layer for first color filters 14 and portions of the barrier layer 12 exposed to the openings are removed by dry etching using the etching mask pattern and a dry etching gas.

The dry etching may be similar to the method described above. In the portions desired to be opened, there is the layer for first color filters 14 having a thickness of several hundreds of nm and the barrier layer 12 thereunder. Therefore, the layer for first color filters 14 is required to be removed first by dry etching.

Layers for forming color filters generally contain a metal-containing organic substance and are not uniform. Because of this, it has been found that, when forming color filters, residues are likely to be generated due to variation in etching rate. In the present embodiment, it is necessary to etch away the layer for first color filters 14 having a thickness of several hundreds of nm and the barrier layer 12 thereunder, while the bottom surfaces are preferably smooth after etching the barrier layer 12. Thus, materials of the color filters are preferably removed by dry etching under conditions leaving no residues.

The dry etching gas may be a gas having reactivity (oxidization and reduction), or may be a gas having etching properties. For example, the gas having reactivity may be a gas containing fluorine, oxygen, bromine, sulfur, chlorine or the like. Furthermore, noble gases containing an element, such as argon or helium, having low reactivity and enabling etching by physical impact of ions, can be used singly or mixed. When performing dry etching under a plasma environment using a gas, the gas is not necessarily limited to gases mentioned above, as long as the gas causes a reaction forming a desired pattern. In the present embodiment, at an earlier stage, etching is principally performed by physical impact using an etching gas containing ions of a noble gas or the like in an amount of 90% or more of the total gas flow rate. Then, fluorine-based gas and oxygen-based gas are mixed into this etching gas for further etching, to improve the etching rate, coupled with the chemical reaction. By increasing the amount of noble gas in the etching gas, the material can be etched so that the layers of the color filters become flat.

When 95% or more of the thickness of the layer for first color filters 14 on the barrier layer 12 has been etched at portions where the second and subsequent color filters 15 and 16 are to be formed, the conditions for etching the barrier layer 12 mentioned above are changed. If residues of the material contained in the color filter layer are observed after the color filter layer has been etched, the flow rate of the noble gas is preferably increased when establishing conditions for etching the barrier layer 12 so as to reduce the etching rate and etch the barrier layer 12 to be flat.

Since a noble gas is used when etching the barrier layer 12, a reaction product or the material to be etched is likely to adhere to the side walls of the mask pattern by physical impact. Thus, reaction product layers 40 made of the reaction product are formed respectively covering the side walls of the barrier layer 12 and the first color filters 14. The width of each reaction product layer 40 is preferably about 1 nm or more and 50 nm or less, although it depends on the etching conditions.

Then, the remaining photosensitive resin mask layer 20a is removed (see FIG. 4(f)). For example, the photosensitive resin mask layer 20a may be removed by a removal method of dissolving and separating the photosensitive resin mask layer 20a by using a chemical solution or a solvent, without affecting the first color filters 14. Examples of the solution for removing the photosensitive resin mask layer 20a include organic solvents, such as N-methyl-2-pyrolidone, cyclohexanone, diethylene glycol monomethyl ether acetate, methyl lactate, butyl lactate, dimethyl sulfoxide, diethylene glycol diethyl ether, propylene glycol monomethyl ether, propylene glycol monoethyl ether, and propylene glycol monomethyl ether acetate. These organic solvents may be used singly or in combination of two or more. The solvent used in this case may preferably be a solvent that does not affect the color filter material. As long as the color filter material is not affected, a separation method using an acidic chemical agent may be used.

The photosensitive resin mask layer 20a may be removed by methods other than the wet process using solutions or the like mentioned above. For example, the photosensitive resin mask layer 20a may be removed by using an ashing technique for resists, which uses photoexcitation or oxygen plasma. These methods may be used in combination. For example, an ashing method by photoexcitation or oxygen plasma may be used first to remove the surface layer that has been altered by dry-etching the surface of the photosensitive resin mask layer 20a, followed by removing the remaining layer by wet etching using a solvent or the like. Further, as long as the material of the first color filters is not damaged, the photosensitive resin mask layer 20a may be removed by only ashing. Not only the dry process such as ashing but also, for example, CMP (chemical mechanical polishing) or the like may be used.

The processes described above completes formation of openings at portions where the second and subsequent color filters 15 and 16 are to be formed. By etching the barrier layer 12 in the above processes, the first color filters 14 are formed on the metal-containing lattice barrier layers 30 and the barrier layer 12. The layer for first color filters 14 and the visible light-transmissive barrier layer 12 are simultaneously etched. Therefore, as shown in FIG. 4(e), faces at an edge portion of each first color filter 14 after etching are continuously connected to respective faces at an edge portion of the visible-light transmissive barrier layer 12 after etching with no step formed therebetween, and with the reaction product layers 40 produced when etching the barrier layer 12 adhering to and covering the continuously connected respective faces of edge portions from outside.

(Forming Patterns of Second and Subsequent Color Filters)

Then, as shown in FIGS. 5(a) to 5(f), second color filters 15 and third color filters 16 containing respective pigments of colors different from that of the first color filters 14 are formed. The methods of producing patterns of the second and third color filters 15 and 16 can be broadly divided into two.

In a first method, the barrier layer 12 and the patterns of the first color filters are used as guide patterns, and the second and third color filters 15 and 16 are formed by using respective photosensitive color filter materials containing a photocurable resin, for selective exposure of the materials by using the conventional method.

In a second method, the processes of forming openings at portions where the second and subsequent color filters are to be formed as described above are repeated a plurality of times. Specifically, a second color filter material is applied to the entire surface of the semiconductor substrate 10 on which the first color filters 14 and the barrier layer 12 have been patterned. Subsequently, the material is dry-etched by using a patterned photosensitive resin mask material layer as an etching mask to form openings at portions where third color filters 16 are to be formed. Finally, a third color filter material is applied filling these openings, and the surplus color filter material is removed by polishing or the like to form third color filters 16 in the respective openings. When the second method is used, portions of the barrier layer 12 where the second and third color filters are to be formed are etched away in the process of forming openings for forming the second and subsequent color filters. However, openings may be formed only at portions where the second color filters are to be formed, followed by application and curing of the material of the second color filters 15, and then openings may be formed at portions where third color filters are to be formed using a patterned photosensitive resin mask material. This method can reduce the etching amount of the materials of the color filters that tend to generate residues, and can advantageously form a flat barrier layer 12. If the second and subsequent color filters 15 and 16 can be processed into desired shapes by the first method, the number of processes can be reduced. Therefore, the first method is preferred to the second method.

(First Method of Forming Patterns of Second and Subsequent Color Filters)

First, referring to FIGS. 5(a) to 5(f), the first method of forming patterns of the second and subsequent color filters 15 and 16 will be described. The first method is characterized in that a color filter material (color resist) containing a photosensitive component is used for the second color filters 15.

As shown in FIG. 5(a), a photosensitive color filter material is applied as a second color filter material to the entire surface of the semiconductor substrate 10 on which the first color filters 14 and the barrier layer 12 have been patterned, i.e., a photosensitive color filter material is applied filling all the openings 20b, and dried to form a layer for second color filters 15. The photosensitive color filter material used in this case contains a negative photosensitive component that is curable by application of light. The second color filters 15 are each preferably formed with a thickness in the range of about 400 nm to 1,000 nm. When the thickness is made large, the concentration of the coloring pigment can be reduced, and therefore the content of the photosensitive curing component can be increased and shape controllability is improved.

Then, as shown in FIG. 5(b), the layer for second color filters 15 is exposed and photocured at portions where second color filters 15 are to be formed, by using a photomask to form second color filters 15.

Then, as shown in FIG. 5(c), portions of the layer for second color filters 15 not selectively exposed in development are removed. Then, the remaining layer for second color filters 15 is cured by high temperature heating to improve adhesion between the exposed portions of the layer for second color filters 15 and the semiconductor substrate 10, and to improve heat resistance in actual use of the device. Thus, the second color filters 15 are formed. In this case, the temperature used for curing is preferably 200° C. or more.

Then, as shown in FIG. 5(*d*), a third color filter material is applied onto the entire surface of the semiconductor substrate 10 to form a layer for third color filters 16. The layer for third color filters 16 preferably has a thickness in the range of 400 nm to 1,000 nm. When the thickness is made large, the concentration of the coloring pigment can be reduced, and therefore the content of the photosensitive curing component can be increased and the shape controllability is improved.

Then, as shown in FIG. 5(*e*), the layer for third color filters 16 is selectively exposed and photocured at portions where third color filters 16 are to be formed.

Next, as shown in FIG. 5(*f*), the photosensitive layer for third color filters 16 is developed, and portions of the layer for third color filters 16 that have not been exposed are removed. Then, the remaining layer for third color filters 16 is cured by high temperature heating to improve adhesion between the exposed portions of the layer for third color filters 16 and the semiconductor substrate 10, and to improve heat resistance in actual use of the device. Thus, the third color filters 16 are formed.

By repeating formation of patterns of the second color filters 15 and the subsequent color filters, color filters with a desired number of colors can be formed.

Figure 6:
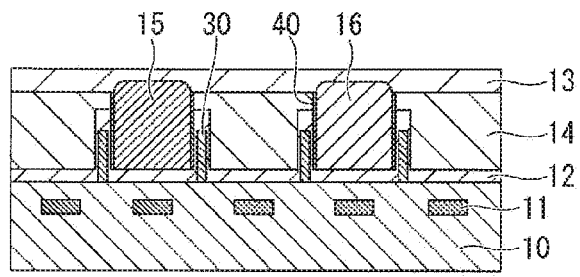
FIGS. 6(a) and 6(b) are cross-sectional views sequentially illustrating steps of preparing microlenses, according to the first embodiment of the present invention.
Figure 6:
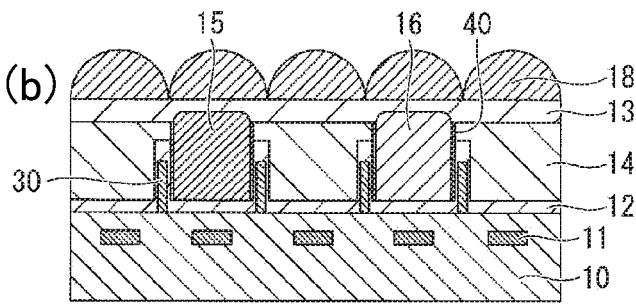

Then, as shown in FIG. 6(*a*), a planarizing overlayer 13 is formed on the color filters 14, 15 and 16 as formed. The planarizing overlayer 13 is made of one or more resins. Examples of the resins include an acrylic resin, an epoxy resin, a polyimide resin, a phenol novolak resin, a polyester resin, a urethane resin, a melamine resin, a urea resin, and a styrene resin. The material for the planarizing overlayer 13 is not limited to these resins. Any material may be used as long as the material transmits visible light having a wavelength in the range of 400 nm to 700 nm and does not inhibit pattern formation or adhesion of the color filters 14, 15 and 16. The planarizing overlayer 13 is preferably made of a resin that does not affect spectral characteristics of the color filters 14, 15 and 16. For example, the planarizing overlayer 13 is preferably formed so as to have a transmittance of 90% or more to visible light having a wavelength in the range of 400 nm to 700 nm. For example, the planarizing overlayer 13 may be formed by using a resin material containing one or more resins such as an acrylic resin mentioned above. In this case, the planarizing overlayer 13 may be formed by applying the resin material to the surface of the semiconductor substrate 10, followed by heating and curing the resin material. Alternatively, for example, the planarizing overlayer 13 may be formed by using a compound such as an oxide or a nitride. In this case, for example, the planarizing overlayer 13 may be formed by various film formation methods such as vapor deposition, sputtering, and CVD.

Finally, as shown in FIG. 6(*b*), microlenses 18 are formed on the planarizing overlayer 13. For example, the microlenses 18 are formed by a known technique such as a method using thermal flow, a method using a gray tone mask, or a method of transferring microlenses to the planarizing overlayer 13 using dry etching.

Figure 7:
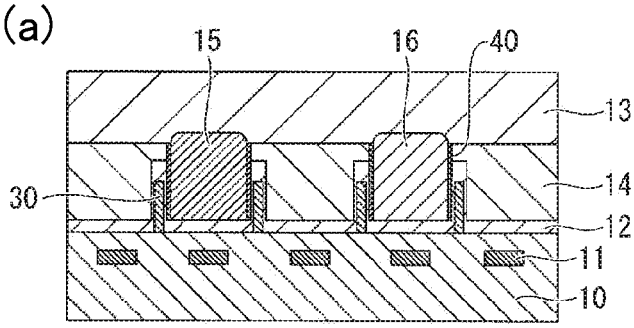
FIGS. 7(a)-7(c) are cross-sectional views sequentially illustrating steps of preparing microlenses by a transfer method using etchback, according to the first embodiment of the present invention.
Figure 7:
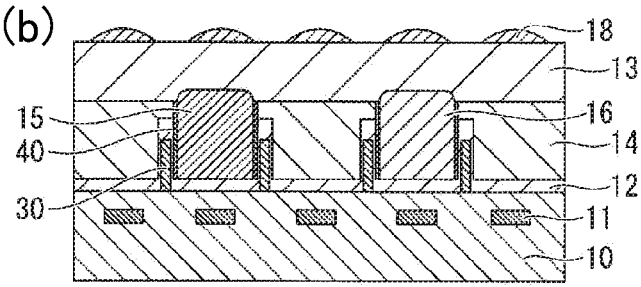
Figure 7:
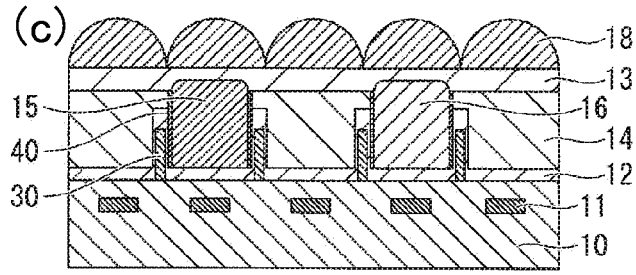

The microlenses may be formed by patterning that uses dry etching of good shape controllability. In this case, as shown in FIG. 7(*a*), a transparent resin layer (which may also serve as the planarizing overlayer 13 as shown in FIG. 7(*a*)) that would finally serve as microlenses is formed first over the color filters 14, 15 and 16. Then, as shown in FIG. 7(*b*), a matrix (lens matrix) of microlenses 18 is formed on the transparent resin layer by a thermal flow method. Then, as shown in FIG. 7(*c*), the configuration of the lens matrix is transferred to the transparent resin layer by dry etching using the lens matrix as a mask. By selecting a height and a material of the lens matrix and adjusting conditions of etching, a suitable lens configuration can be transferred to the transparent resin layer.

Using the above method, microlenses 18 can be formed with good controllability. The above method is preferably used for producing microlenses 18 each having a height in the range of 400 nm to 800 nm from the lens top to the lens bottom.

Through the processes described above, a solid-state imaging device of the present embodiment is completed.

In the present embodiment, it is preferable that color filters occupying a largest area are firstly formed as the first color filters 14. Then, the second color filters 15 and the third color filters 16 are sequentially formed by photolithography using a photosensitive color resist.

The technique of using a photosensitive color resist is a conventional technique of producing color filter patterns. The first color filter material and the barrier layer 12 are formed with good rectangularity. By using these patterns as guide patterns, the second color filters 15 and the third color filters 16 can be formed filling sites each enclosed by four sides. Thus, even when photosensitive color resists are used for the second and subsequent color filters, resolution of the color resists does not need to be emphasized as in the conventional art. Accordingly, the amount of the photocurable components can be reduced in the respective photocurable resins, leading to increasing the ratio of the coloring components in the color filter materials and reducing thickness of each of the color filters 15 and 16.

At the portions where the second and subsequent color filters 15 and 16 are to be formed, the barrier layer 12 has been etched away when etching the layer for first color filters 14. Thus, the semiconductor substrate 10 or the barrier layer 12 is exposed to the surface. In this case, the surface of the semiconductor substrate 10 or the barrier layer 12 may have been oxidized and become hydrophilic. If the second and subsequent color filters are formed on the surface of the semiconductor substrate 10 or the barrier layer 12 by photolithography, a developing solution may penetrate into portions where the hydrophilic semiconductor substrate 10 or the barrier layer 12 contacts the second and subsequent color filters. Accordingly, the second and subsequent color filter patterns (patterns of the second and third color filters 15 and 16) may be separated. Thus, depending on the state of the surface, possible separation of the second and subsequent color filter patterns can be reduced by making the exposed surface hydrophobic by using an existing method, e.g., HDMS (hexamethyldisilazane) treatment.

In the present embodiment, the first color filters 14 are preferably made of a color filter material in which the content of the resin component and the like associated with photocuring is low and the content of the pigment is high. In particular, the content of the pigment in the first color filter material may preferably be 70 mass % or more. With this content, the first color filters 14 can be formed with high precision and with no residues or separation, even when the first color filter material contains a pigment at a concentration that would achieve only insufficient curing in the conventional photolithography using a photosensitive color resist. Specifically, when green filters are used as first color filters 14, the photocurable component of red filters or blue filters can be reduced. Accordingly, even when the content of the pigment is high, the individual color filter patterns can be easily formed by photolithography.

Anyway, it is preferable that the firstly formed first color filters 14 are formed by using a first color filter material containing a reduced amount of photosensitive component to place emphasis on photocuring rather than patterning and to mainly cure the thermosetting component. Thus, the first color filters 14 are intimately brought into contact with the semiconductor substrate 10 and the barrier layer 12, without producing residues or causing separation during formation of other color filters, and can achieve high resolution. Then, the second and third color filters 15 and 16 are formed using photosensitive second and third color filter materials by photolithography with high efficiency and with a smaller number of processes. Thus, since the firstly formed patterns of the first color filters 14 are accurate, patterns of the second and third color filters 15 and 16 can be formed with high shape definition by photolithography.

(Second Method of Forming Patterns of Second and Subsequent Color Filters)

Referring to FIGS. 8(a) to 8(h), a second method of forming patterns of the second and subsequent color filters 15 and 16 will be described. The second method is characterized in that layers of the second and third color filters 15 and 16 are each made of a non-photosensitive color filter material. The second method will be described with reference to the drawings.

Figure 8:
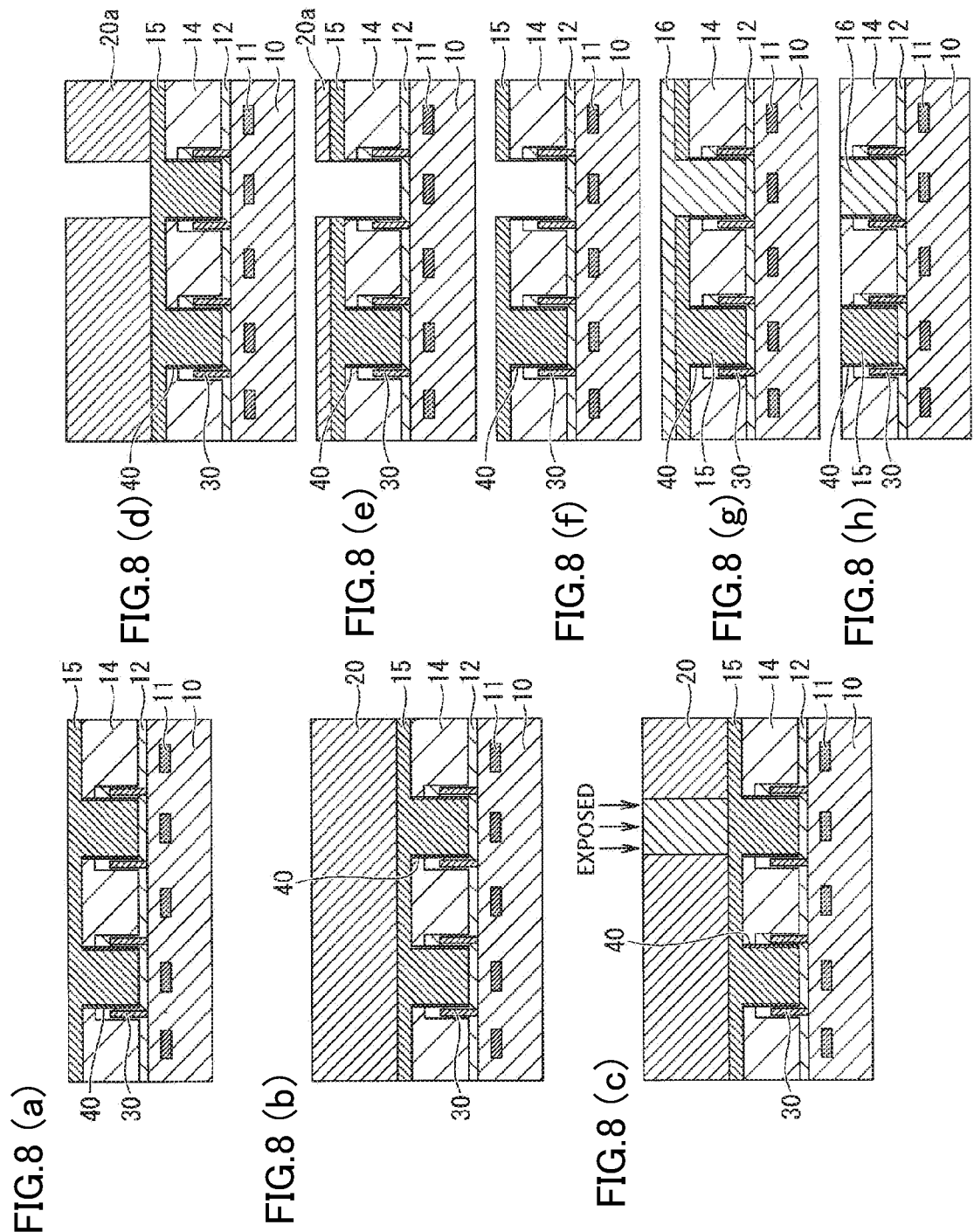
FIGS. 8(a)-8(h) are cross-sectional views sequentially illustrating steps of preparing second and third color filter patterns by dry etching, according to the first embodiment of the present invention.

As shown in FIG. 8(a), there is prepared a substrate in which the layer for first color filters 14 and the barrier layer 12 are opened at positions where the second and subsequent color filters are to be formed, and then a second color filter material is applied to the substrate. The second color filter material used in this case is a non-photosensitive thermosetting resin material that is cured by being heated. The second color filter material, which is not photosensitive, does not need to contain a photosensitive component, and thus concentration of a pigment can be easily increased as mentioned above. Accordingly, the second color filters 15 can be made thin. After that, the second color filter material is heated at high temperature and cured to form a layer for second color filters 15. Heating is preferably performed at a temperature not affecting the devices. Specifically, the heating temperature is preferably 300° C. or less, and more preferably 240° C. or less.

Then, as shown in FIG. 8(b), a photosensitive resin mask material is applied onto the layer for second color filters 15 to form an etching mask 20.

Subsequently, as shown in FIGS. 8(c) and 8(d), the photosensitive resin mask material is exposed and developed so that portions thereof where the third color filters 16 are to be arranged are opened. Thus, a photosensitive resin mask layer 20a having openings is formed.

Subsequently, as shown in FIG. 8(e), the layer for second color filters 15 is dry-etched using the photosensitive resin mask layer 20a having the openings. In this case, portions of the layer for second color filters 15, which are unnecessary for arranging the third color filters 16, are etched away to form openings. In this case, the photosensitive resin mask layer 20a may be cured by heating, application of ultraviolet light, or the like. Then, as shown in FIG. 8(f), the photosensitive resin mask layer 20a is removed by a known removal method, such as separation or cleaning using a solvent, or asking using photoexcitation or oxygen plasma. As a result of these processes, openings are formed at portions for forming third color filters 16, and at portions other than these, the first and second color filters 14 and 15 are formed.

Then, as shown in FIG. 8(g), a third color filter material is applied to the entire surface of the semiconductor substrate 10, on which the first and second color filters 14 and 15 have been formed, to fill the openings, followed by heating and curing to thereby form a layer for third color filters 16. After that, as shown in FIG. 8(h), the extra layer for third color filters 16 on the first and second color filters 14 and 15 is reduced to a predetermined thickness, for example, by polishing such as CMP, or by etch back using a dry etching technique. Finally, the extra layer for third color filters 16 is removed using a known technique, such as a technique of flattening or technique of reducing a film to a desired thickness, to provide third color filters 16.

If the fourth and subsequent color filters are to be formed, the color filter materials are each applied and cured similarly to the second and third color filters 15 and 16. After that, a photosensitive resin material is dry-etched as a photosensitive resin mask layer 20a having openings formed by patterning. Then, the extra photosensitive resin mask layer 20a is removed. Thus, color filters for a plurality of colors are formed.

By forming a planarizing overlayer 13 and microlenses 18 on the color filters for the plurality of colors as formed, a solid-state imaging device of the present embodiment is completed.

In the second method of forming all the colors by dry etching, the second color filters are required to be dry-etched to the full thickness thereof to form openings at positions where the third color filters are to be formed. However, dry etching of color filter materials is likely to generate residues. Therefore, as shown in FIGS. 9(a) to 10(n), the barrier layer 12 may be dry-etched separately at portions where the second color filters are to be formed and at portions where the third color filters are to be formed. Referring to FIGS. 9(a)-9(t), the following description explains the case of separately providing portions where the second color filters are to be formed and portions where the third color filters are to be formed in the barrier layer 12.

As shown in FIGS. 9(a) to 9(d), an etching mask pattern is formed on the layer for first color filters 14 and the barrier layer 12 formed in the previous processes, so as to have openings at positions where the second color filters are to be formed.

First, as shown in FIG. 9(a), a semiconductor substrate 10 on which a layer for first color filters 14 and a barrier layer 12 are formed is prepared.

Then, as shown in FIG. 9(b), a photosensitive resin mask material is applied to the surface of the layer for first color filters 14 and dried to form an etching mask 20.

Then, as shown in FIG. 9(c), the etching mask 20 is exposed using a photomask (not shown) to cause a chemical reaction with which areas other than required patterns are made soluble in a developing solution.

Then, as shown in FIG. 9(d), unwanted portions (exposed portions) of the etching mask 20 are removed by development. In this way, a photosensitive resin mask layer 20a having openings is formed. Second color filters will be formed in these openings in a later process.

Subsequently, as shown in FIG. 9(e), using the photosensitive resin mask layer 20a having openings, portions of the layer for first color filters 14 and the barrier layer 12, which are unnecessary for arranging second color filters 15, are dry-etched away to form openings. In this case, the photosensitive resin mask layer 20a may be cured by heating, application of ultraviolet light, or the like.

Then, as shown in FIG. 9(f), the photosensitive resin mask layer 20a is removed by a known removal method, such as separation or cleaning using a solvent, or ashing using photoexcitation or oxygen plasma. As a result of the processes described above, openings are formed at positions for forming second color filters 15, and the remainder are provided with the first color filters 14 and the barrier layer 12.

Figure 10:
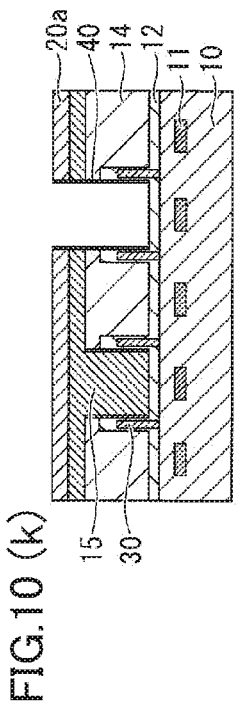
FIGS. 10(g)-10(n) are cross-sectional views sequentially illustrating steps of preparing second and third color filter patterns by forming openings in the barrier layer by dry etching, followed by coating and curing, according to the first embodiment of the present invention.
Figure 10:
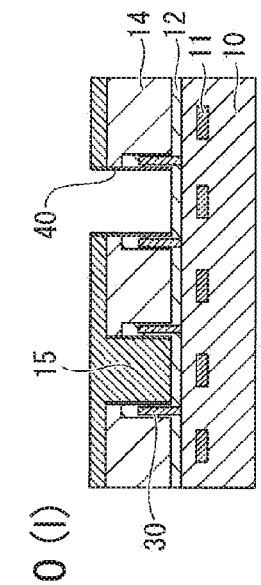
Figure 10:
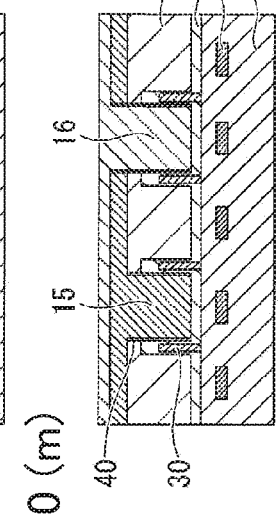
Figure 10:
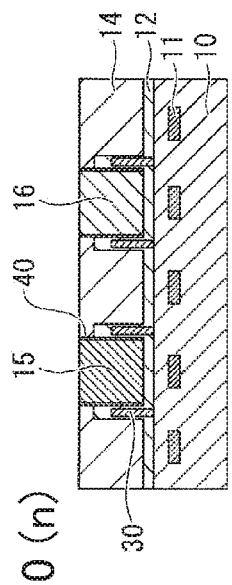
Figure 10:
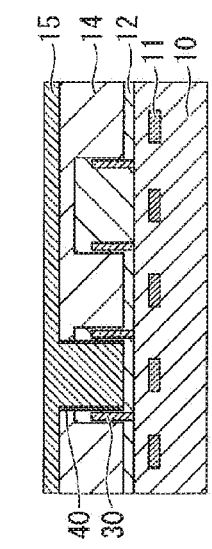
Figure 10:
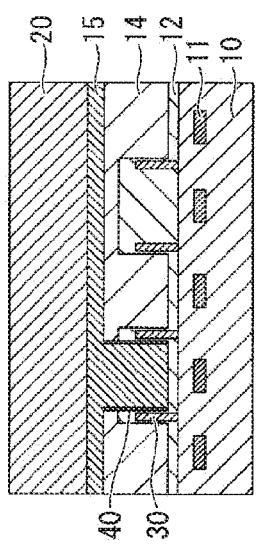
Figure 10:
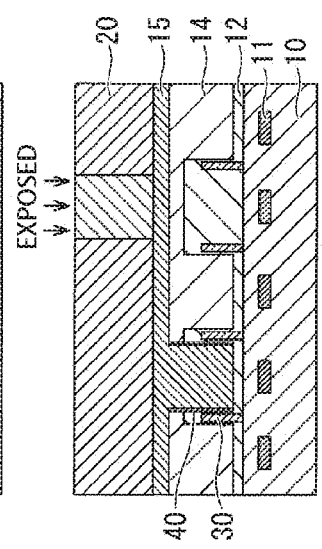
Figure 10:
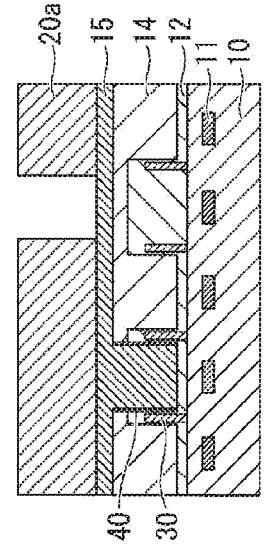

Then, as shown in FIG. 10(*g*), a second color filter material is applied to the entire surface of the semiconductor substrate 10, on which the first color filters 14 and the barrier layer 12 have been formed, to fill the openings, followed by heating and curing to thereby form a layer for second color filters 15.

As shown in FIGS. 10(*h*) to 10(*k*), an etching mask pattern is formed on the layers for first and second color filters 14 and 15 and the barrier layer 12 formed in the previous processes, so as to have openings at portions where third color filters are to be formed.

First, as shown in FIG. 10(*h*), a photosensitive resin mask material is applied to the resultant object and dried to form an etching mask 20.

Then, as shown in FIG. 10(*i*), the etching mask 20 is exposed using a photomask (not shown) to cause a chemical reaction with which areas other than required patterns are made soluble in a developing solution.

Then, as shown in FIG. 10(*j*), unwanted portions (exposed portions) of the etching mask 20 are removed by development. In this way, a photosensitive resin mask layer 20*a* having openings is formed. In these openings 20*b*, third color filters will be formed in a later process.

Subsequently, as shown in FIG. 10(*k*), using the photosensitive resin mask layer 20*a* having openings, portions of the layers for first and second color filters 14 and 15 and the barrier layer 12, which are unnecessary for arranging third color filters 16, are dry-etched away to form openings. In this case, the photosensitive resin mask layer 20*a* may be cured by heating, application of ultraviolet light, or the like.

Then, as shown in FIG. 10(*l*), the photosensitive resin mask layer 20*a* is removed by a known removal method, such as separation or cleaning using a solvent, or ashing using photoexcitation or oxygen plasma. As a result of the processes described above, openings are formed at positions for forming the third color filters 16, and the remainder are provided with the first and second color filters 14 and 15 and the barrier layer 12.

Then, as shown in FIG. 10(*m*), a third color filter material is applied to the entire surface of the semiconductor substrate 10, on which the first and second color filters 14 and 15 and the barrier layer 12 have been formed, to fill the openings, followed by heating and curing to thereby form a layer for third color filters 16.

After that, as shown in FIG. 10(*n*), the extra layer for third color filters 16 on the first and second color filters 14 and 15 is reduced to a predetermined thickness, for example, by polishing such as CMP, or by performing etch back during dry etching. Finally, the extra layer for third color filters 16 is removed using a known technique, such as a technique of flattening or technique of reducing a film to a desired thickness, to provide third color filters 16.

If all the color filters are formed by dry etching, use of the method shown in FIGS. 9(*a*)-9(*f*) and 10(*g*)-10(*n*) eliminates the necessity of etching the color filter materials, which are likely to generate residues, to the full thickness thereof. Thus, the material of only the barrier layer 12 is required to be etched to the full thickness of the color filters. $SiO_2$, ITO, or the like, when used as a material for the barrier layer 12, is easily shapeable depending on the etching conditions, and thus the material can be advantageously easily etched into a desired shape.

In the first method described above, the second color filters 15 and the subsequent color filters are formed by photolithography. Specifically, in the first method, the color filter materials for the second color filters 15 and the subsequent color filters are made photocurable and selectively exposed and developed to form the second color filters 15 and the subsequent color filters.

In the second process described above, dry etching is repeated to form color filters. In the second method, the color filter materials for the second color filters 15 and the subsequent color filters are formulated to contain a thermosetting component instead of photosensitive component, and applied to the entire surface of the substrate and thermally cured. Then, a photosensitive resin mask material is formed as an etching mask on the first and second color filters 14 and 15 desired to be left to similarly produce the second color filters 15 and the subsequent color filters by dry etching. In these two methods, the same processes are repeated to form the second and third color filters 15 and 16. However, these processes may be combined, as long as desired spectral characteristics are obtained.

In the first embodiment, a thermosetting resin and a photocurable resin are both used for the first color filters 14. However, either a thermosetting resin or a photocurable resin may be used for the first color filters 14. In the process of curing the first color filters 14, these filters are photocured by exposure and thermally cured by heat. To make the color filters thin, the pigment concentration needs to be high. When the content of the pigment is high, however, the color filters are likely to suffer reduced solvent resistance. Accordingly, if the color filters come into contact with a solvent in the process of development, or removal of etching mask, or application or development of the second and subsequent color filters 15 and 16, or the like, the component of the first color filters 14 may seep into the solvent, and affect the spectral characteristics. The solvent resistance can be improved by mixing a photosensitive photocurable resin into the color filter materials and exposing the materials to cure the surfaces of the color filters, and by mixing a thermosetting resin into the color filter materials and heat-curing the materials at a high temperature to cure the inside and surfaces of the color filters. In the present embodiment, since the shape of the visible-light transmissive barrier layer 12 can be controlled easily by dry etching, the degree of freedom in dimensional control is high. Thus, the barrier between color filters can be easily formed with a small width. Owing to these characteristics, an imaging device can be easily shaped with a pixel size smaller than 1.4 μm×1.4 μm.

2. Second Embodiment

Figure 11:
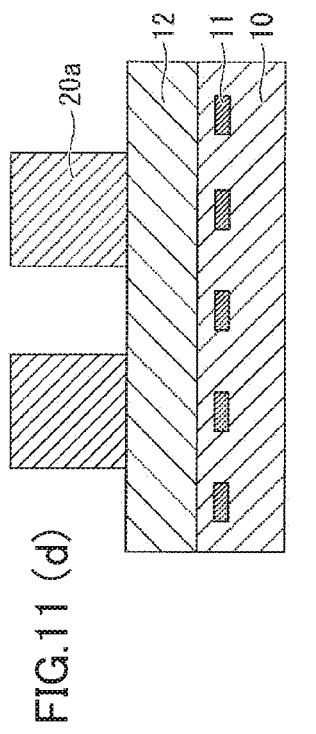
FIGS. 11(a)-11(f) are cross-sectional views sequentially illustrating steps of forming openings at portions where first color filter patterns are to be formed, according to a second embodiment of the present invention.
Figure 11:
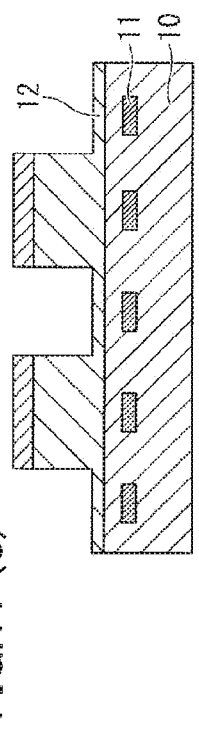
Figure 11:
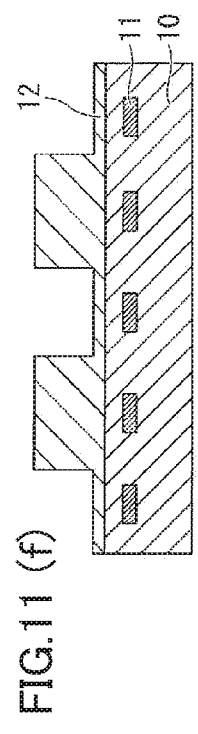
Figure 11:
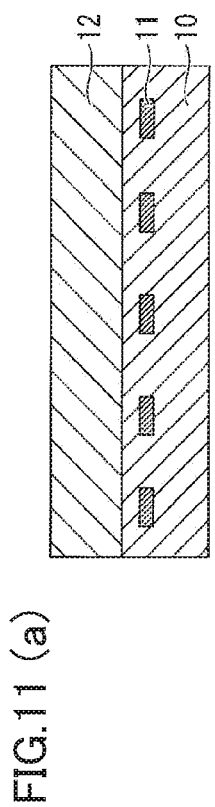
Figure 11:
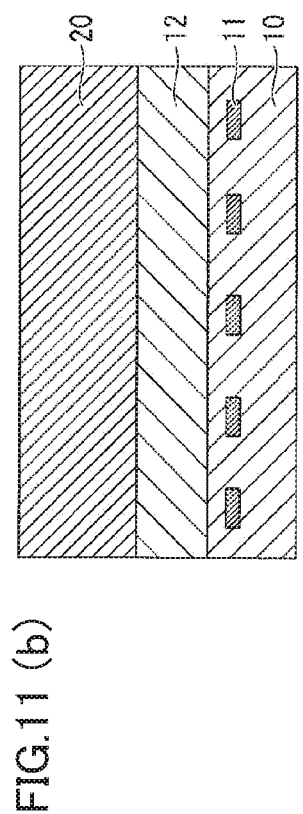
Figure 11:
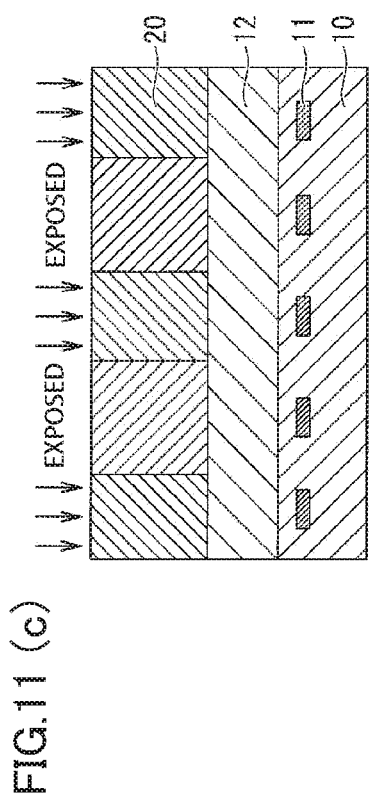
Figure 13:
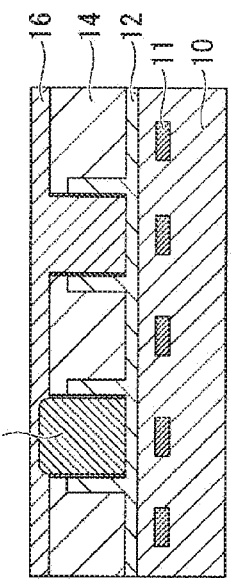
FIGS. 13(a)-13(f) are cross-sectional views sequentially illustrating steps of preparing second and third color filter patterns by photolithography, according to the second embodiment of the present invention.
Figure 13:
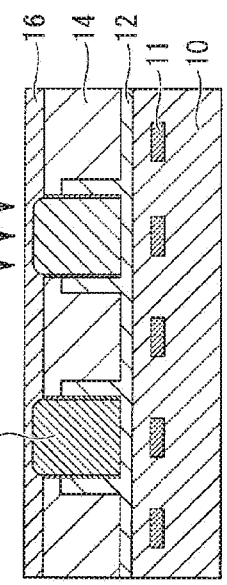
Figure 13:
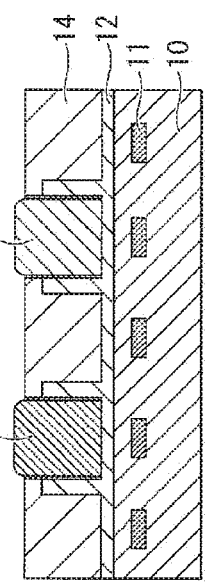
Figure 13:
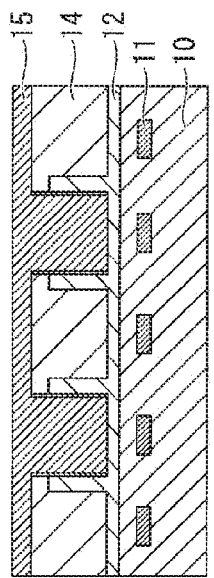
Figure 13:
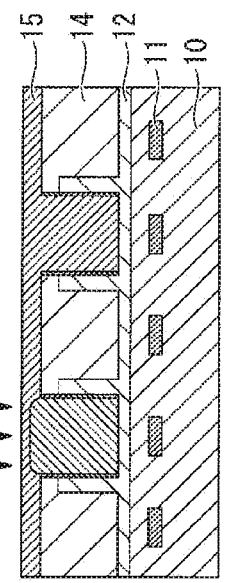
Figure 13:
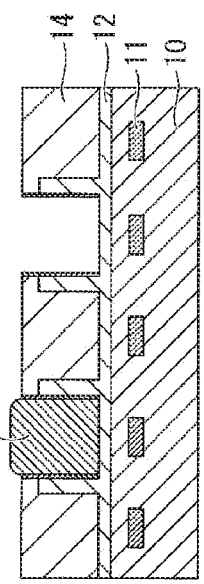

Referring now to FIGS. 11(*a*)-11(*f*), a description will be given of a solid-state imaging device and a method of producing a solid-state imaging device according to a second embodiment of the present invention. The solid-state imaging device according to the second embodiment of the present invention has a structure including no component corresponding to the metal-containing lattice barrier layers 30 of the first embodiment.

(2-1) Configuration of Solid-State Imaging Device

Since the solid-state imaging device of the second embodiment includes no metal-containing lattice barrier layers 30 in the barrier layer 12, the barrier layer 12 can be formed with a small width. In addition, color mixing can be reduced by making the refractive index of the barrier layer 12 different from those of color filter materials. Thus, compared to the conventional structure including neither metal-containing lattice barrier layers 30 nor barrier layer 12, color mixing can be minimized. Further, residues generated when removing the color filters by dry etching can be reduced, and color filters 14, 15 and 16 can be formed with good rectangularity and reduced thickness.

The solid-state imaging device according to the second embodiment of the present invention includes a semiconductor substrate 10 and microlenses 18. The semiconductor substrate 10 includes a plurality of two-dimensionally arranged photoelectric conversion elements 11. The solid-state imaging device of the second embodiment also includes color filters 14, 15 and 16 for a plurality of colors between the semiconductor substrate 10 and the microlenses 18, a barrier layer 12 provided on the semiconductor substrate 10, and a planarizing overlayer 13 provided on the surfaces of the color filters 14, 15 and 16.

In the solid-state imaging device of the second embodiment, components similar to those of the solid-state imaging device of the first embodiment are given the same reference signs. Specifically, the semiconductor substrate 10 having the photoelectric conversion elements 11, as well as the barrier layer 12, the color filters 14, 15 and 16, the planarizing overlayer 13, and the microlenses 18 all have respective configurations similar to those of the solid-state imaging device of the first embodiment. Therefore, detailed description will be omitted for components common to those of the solid-state imaging device of the first embodiment.

(2-2) Method of Producing Solid-State Imaging Device

Referring to FIGS. 11(a)-11(f), a method of producing the solid-state imaging device according to the second embodiment of the present invention will be described.

As shown in FIG. 11(a), a barrier layer 12 is formed on a semiconductor substrate 10 that includes a plurality of two-dimensionally arranged photoelectric conversion elements 11.

Then, as shown in FIGS. 11(b) to 11(d), an etching mask 20 is formed on the barrier layer 12 to form a photosensitive resin mask layer 20a.

Specifically, a photosensitive resin mask layer 20a is formed by exposing and developing the etching mask 20 by using a photomask so that portions where the first color filters are to be formed are opened. When forming the photosensitive resin mask layer 20a, portions where the first color filters are to be formed may have a larger size, unlike in the first embodiment. Similarly, when forming openings at portions where second and third color filters are to be formed, the size may be made larger. The etching mask used when dry-etching the barrier layer 12 is formed such that the width of the barrier layer 12 between color filters is preferably about 1 nm to 200 nm, and more preferably 5 nm to 50 nm.

The subsequent processes are the same as those of the first embodiment described above (see FIGS. 11(e), 11(f), 12(a)-12(f), and 13(a)-13(f). Thus, description of these processes is omitted.

In the embodiments described above, green filters serve as the first color filters 14, but the present invention is not limited to this. For example, blue or red filters may be used as the first color filters 14. Specifically, the method of producing a solid-state imaging device according to the present embodiment uses resins configuring the color filters 14, 15 and 16 for a plurality of colors and pigments imparting colors thereto. When the color filters 14, 15 and 16 are formulated to contain pigments at concentrations of 50 mass % or more, those color filters which have a largest curvature radius may be selected as first color filters. The curvature radius in this case is measured at an edge portion of each of the colors filter after being shaped, with the resin forming the color filters being cured by the photosensitive component contained therein. Thus, color of the first color filters is not limited.

EXAMPLES

The solid-state imaging device according to an embodiment of the present invention will be specifically described below by way of examples.

Example 1

A tungsten film with a thickness of 200 nm was formed by CVD on a semiconductor substrate including two-dimensionally arranged photoelectric conversion elements. Then, the resultant object was spin-coated with a positive resist (OFPR-800: manufactured by Tokyo Ohka Kogyo Co., Ltd.) at a rotation speed of 1,000 rpm by using a spin coater, followed by prebaking at 90° C. for 1 minute. Thus, a sample was produced. The sample had a coating of the photoresist as a photosensitive resin mask material layer (etching mask) with a thickness of 1.5 μm.

Ultraviolet light was irradiated to the positive resist which was a photosensitive resin mask material layer to cause a chemical reaction and make the layer soluble in a developing solution.

The sample was exposed via a photomask by photolithography. The sample was exposed by using an exposure device that included a light source of an i-line wavelength.

Then, the sample was developed by using 2.38 mass % TMAH (tetramethylammonium hydride) as a developing solution to form a photosensitive resin mask layer having openings at positions at which second and third color filters are to be formed. When a positive resist is used, development is usually followed by dehydration baking to cure the photoresist serving as a photosensitive resin mask material layer. In this example, dehydration baking was performed at a temperature of 120 degrees. The resist was formed with a thickness of 1.5 μm, which was twice or more the thickness of the first color filters, i.e., green filters.

Then, the sample was dry-etched by using the photosensitive resin mask layer as formed. In this case, a parallel plate dry etching device was used. The sample was dry-etched stepwise with the etching conditions being changed so as not to affect the semiconductor substrate serving as a base.

First, the sample was etched by using a mixture of two gases, i.e., $SF_6$ gas and Ar gas. The flow rate of the $SF_6$ gas was set to 50 ml/min and that of the Ar gas was set to 100 ml/min. In this case, the internal pressure of the chamber was set to 2 Pa and the RF power was set to 1,000 W. When the sample was etched to a depth of about 180 nm corresponding to 90% of the total thickness 200 nm of the tungsten layer under these conditions, the etching conditions were changed.

Next, the sample was etched by using a mixture of three gases, i.e., $SF_6$ gas, $O_2$ gas, and Ar gas. The flow rate of the $SF_6$ gas was set to 5 ml/min, that of the $O_2$ gas was set to 50 ml/min, and that of the Ar gas was set to 100 ml/min, and the tungsten layer was etched to the full thickness thereof.

Then, the photosensitive resin mask material used as an etching mask was removed. The method used in this case was a method using a solvent. Specifically, the resist was removed by means of a spray cleaning device using a stripping solution 104 (manufactured by Tokyo Ohka Kogyo Co., Ltd.). After that, the sample was subjected to ashing with oxygen plasma to remove the remaining resist. Through these processes, a lattice tungsten barrier structure having a thickness of 200 nm and a width of 80 nm was formed on the semiconductor substrate.

Then, the sample was spin-coated with a SOG material at a rotation speed of 1,000 rpm, followed by heat treatment at 250° C. for 30 minutes using a hot plate to thereby form a $SiO_2$ film with a thickness of 350 nm, filling the lattice tungsten barrier structure.

Then, the resultant object was spin-coated with a positive resist (OFPR-800: manufactured by Tokyo Ohka Kogyo Co., Ltd.) at a rotation speed of 1,000 rpm by using a spin coater, followed by prebaking at 90° C. for 1 minute. Thus, a sample was produced. The sample had a coating of the photoresist as a photosensitive resin mask material layer with a thickness of 1.5 μm.

Ultraviolet light was irradiated to the positive resist as a photosensitive resin mask material layer to cause a chemical reaction and make the layer soluble in a developing solution.

The sample was exposed via a photomask by photolithography. The sample was exposed by using an exposure device that included a light source of an i-line wavelength.

Then, the sample was developed by using 2.38 mass % TMAH (tetramethylammonium hydride) as a developing solution to form a photosensitive resin mask layer having openings at positions at which second and third color filters are to be formed. When a positive resist is used, development is usually followed by dehydration baking to cure the photoresist serving as a photosensitive resin mask material layer. In this example, dehydration baking was performed at a temperature of 120 degrees. The resist was formed with a thickness of 1.5 μm, which was twice or more the thickness of the first color filters, i.e., green filters. Pattern openings in this case were each 0.9 μm×0.9 μm.

Then, the sample was dry-etched by using the photosensitive resin mask layer as formed. In this case, a parallel plate dry etching device was used. The sample was dry-etched stepwise with the etching conditions being changed so as not to affect the semiconductor substrate serving as a base.

First, the sample was etched by using a mixture of three gases, i.e., $CF_4$ gas, $O_2$ gas and Ar gas. The flow rate of the $CF_4$ gas was set to 50 ml/min, that of the $O_2$ gas was set to 10 ml/min, and that of the Ar gas was set to 100 ml/min. In this case, the internal pressure of the chamber was set to 2 Pa and the RF power was set to 1,000 W. When the sample was etched to a depth of about 280 nm corresponding to 80% of the total thickness 350 nm of the $SiO_2$ layer under these conditions, the etching conditions were changed.

Then, the sample was etched by using a mixture of three gases, i.e., $CF_4$ gas, $O_2$ gas and Ar gas. The flow rate of the $CF_4$ gas was set to 25 ml/min, that of the $O_2$ gas was set to 10 ml/min, and that of the Ar gas was set to 200 ml/min. In this case, the internal pressure of the chamber was set to 5 Pa and the RF power was set to 300 W.

Then, the $O_2$ gas was mixed with the Ar gas, with the flow rate of the $O_2$ gas being set to 200 ml/min and that of the Ar gas being set to 10 ml/min. The sample was etched under the conditions of the internal pressure of the chamber being 1.5 Pa and the RF power being 400 W. Under these conditions, surfaces of $SiO_2$ were flattened at portions etched.

Then, the photosensitive resin mask material used as an etching mask was removed. The method used in this case was a method using a solvent. Specifically, the resist was removed by means of a spray cleaning device using a stripping solution 104 (manufactured by Tokyo Ohka Kogyo Co., Ltd.).

Then, a green pigment dispersion containing a photosensitive curable resin and a thermosetting resin was prepared as a first color filter material containing a green pigment as a first color. The sample was spin-coated with this green pigment dispersion at a rotation speed of 1,000 rpm. The green pigment of the first-color color filter material was C.I. PG 58. The filter material had a 70 mass % green pigment concentration and a 500 nm thickness.

Then, the first color filter material was cured. Specifically, the entire surface of the first color filter material was exposed by using a stepper, i.e., an i-line exposure device, to cure the photosensitive component. The surface of the color filter was cured by the photosensitive curable component. Subsequently, the resultant object was baked at 230° C. for 6 minutes to thermally cure the green filter layer.

Then, the resultant object was spin-coated with a positive resist (OFPR-800: manufactured by Tokyo Ohka Kogyo Co., Ltd.) at a rotation speed of 1,000 rpm by using a spin coater, followed by prebaking at 90° C. for 1 minute. Thus, a sample was produced. The sample had a coating of the photoresist as a photosensitive resin mask material layer with a thickness of 1.5 μm.

Ultraviolet light was irradiated to the positive resist as a photosensitive resin mask layer to cause a chemical reaction and make the layer soluble in a developing solution.

The sample was exposed via a photomask by photolithography. The sample was exposed by using an exposure device that included a light source of an i-line wavelength.

Then, the sample was developed by using 2.38 mass % TMAH (tetramethylammonium hydride) as a developing solution to form a photosensitive resin mask layer having openings at positions at which second and third color filters are to be formed. When a positive resist is used, development is usually followed by dehydration baking to cure the photoresist serving as a photosensitive resin mask material layer. In this example, dehydration baking was performed at a temperature of 120 degrees. The resist was formed with a thickness of 1.5 μm. Pattern openings in this case were each 0.9 μm×0.9 μm. Through these processes, a mask pattern having openings at positions where the second and subsequent color filters are to be formed was produced.

Then, the sample was dry-etched by using the photosensitive resin mask layer as formed. Since there was the green material as first color filters with a thickness of 150 nm on the 350 nm barrier layer formed of the $SiO_2$ layer, it was necessary to firstly remove the green material by dry etching without generating much residue. Therefore, the green material was dry-etched stepwise.

First, the sample was etched by using a mixture of three gases, i.e., $CF_4$ gas, $O_2$ gas and Ar gas. The flow rate of the $CF_4$ gas was set to 5 ml/min, that of the $O_2$ gas was set to 5 ml/min, and that of the Ar gas was set to 100 ml/min. In this case, the internal pressure of the chamber was set to 2 Pa and the RF power was set to 1,000 W. When the sample was etched to a depth of 135 nm corresponding to 90% of the thickness 150 nm of the green layer under these conditions, the etching conditions were changed.

Then, the sample was etched by using a mixture of three gases, i.e., $CF_4$ gas, $O_2$ gas and Ar gas. The flow rate of the $CF_4$ gas was set to 50 ml/min, that of the $O_2$ gas was set to 10 ml/min, and that of the Ar gas was set to 100 ml/min. In this case, the internal pressure of the chamber was set to 2 Pa and the RF power was set to 1,000 W. When the sample was etched to a depth of about 280 nm corresponding to 80% of the thickness 15 nm of the first filters and the total thickness 350 nm of the $SiO_2$ layer under these conditions, the etching conditions were changed.

Then, the sample was etched by using a mixture of three gases, i.e., $CF_4$ gas, $O_2$ gas and Ar gas. The flow rate of the $CF_4$ gas was set to 25 ml/min, that of the $O_2$ gas was set to 10 ml/min, and that of the Ar gas was set to 200 ml/min. In this case, the internal pressure of the chamber was set to 5 Pa and the RF power was set to 300 W. Under these conditions, the sample was etched so as to progress the removal of the reaction product adhered to the side surfaces of the photoresist serving as an etching mask.

Then, the $O_2$ gas was mixed with the Ar gas, with the flow rate of the $O_2$ gas being set to 200 ml/min and that of the Ar gas being set to 10 ml/min. The sample was etched under the conditions of the internal pressure of the chamber being 1.5 Pa and the RF power being 400 W. Under these conditions, surfaces of $SiO_2$ were flattened at portions etched. When the $SiO_2$ was etched, the reaction product of $SiO_2$ and the dry etching gases adhered to the side walls of the green layer segments. The reaction product in this case was mainly $SiO_2$ adhered by physical impact of Ar gas. The adhesion was observed on the side walls in the lateral (width) direction and had a thickness of about 10 nm.

Then, the photosensitive resin mask material used as an etching mask was removed. The method used in this case was a method using a solvent. Specifically, the resist was removed by means of a spray cleaning device using a stripping solution 104 (manufactured by Tokyo Ohka Kogyo Co., Ltd.).

(Production of Second Color Filters)

Then, second color filters were formed. At portions where the second and third color filters were to be formed, the $SiO_2$ layer as a barrier layer had been exposed in the process of forming the first color filters. Thus, the surface had become hydrophilic, and accordingly, a developing solution might penetrate to the surface during development, causing separation of the second color filters. Therefore, HMDS treatment was performed to make the exposed $SiO_2$ layer hydrophobic.

Then, a photosensitive second color filter material containing a blue pigment dispersion was applied to the entire surface of the semiconductor substrate to form second color filters.

Then, the photosensitive second color filter material was selectively exposed by photolithography using patterns of a photomask.

Then, the photosensitive color filter material was developed to form blue second color filters.

In this case, pigments used for the photosensitive color filter material of the blue resist were C.I. PB 156 and C.I. PV 23, and the pigment concentration was 50 mass %. The blue second color filters had a thickness of 0.70 μm. As a resin, i.e., a main component of the blue resist, a photosensitive acrylic resin was used.

Then, the resultant object was placed in an oven and cured at 230° C. for 30 minutes to firmly cure the photosensitive second color filter material which would serve as second color filters (blue filters). After this heating, no separation, pattern deformation, or the like was observed even after the process of forming third color filters or other processes. The second color filters were formed with good rectangularity because they were each surrounded by the first color filters having good rectangularity. Thus, it was confirmed that the second color filters had been cured with good adhesion to the bottoms and the surrounding filters.

(Production of Third Color Filters)

Then, a photosensitive third color filter material containing a red pigment dispersion was applied to the entire surface of the semiconductor substrate to form third color filters.

Then, the photosensitive third color filter material was selectively exposed with photomask patterns by photolithography.

Then, the photosensitive third color filter material was developed to form red third color filters.

In this case, pigments used for the photosensitive color filter material of the red resist were C.I. PR 254 and C.I. PY 139, and the pigment concentration was 60 mass %. The red third color filters had a thickness of 0.80 μm.

Then, the photosensitive third color filter material serving as the third color filters (red color filters) was heated in an oven at 230° C. for 20 minutes and firmly cured. In this case, the third color filters were formed with good rectangularity because they were each surrounded by the first color filters having good rectangularity. Thus, it was confirmed that the third color filters had been cured with good adhesion to the bottoms and the surrounding filters.

Then, the color filters formed through the flow described above were spin-coated with a coating liquid containing an acrylate resin, at a rotation speed of 1,000 rpm, followed by heating and curing the resin at 200° C. for 30 minutes using a hot plate, thereby forming a planarizing overlayer.

Finally, on the planarizing overlayer, microlenses each having a height of 500 nm from the lens top to the lens bottom were formed by a transfer method using etchback, i.e., the known technique mentioned above. Thus, a solid-state imaging device of Example 1 was completed.

The solid-state imaging device thus obtained included a lattice tungsten barrier with the lattice cells being covered with a barrier of $SiO_2$ and green filters formed with good rectangularity by dry etching. Further, the side walls of the $SiO_2$ barrier and the side walls of the green filters each had adhesion of the reaction product (mainly containing $SiO_2$) of about 10 nm thickness which had been generated when the $SiO_2$ barrier was patterned by dry etching. Since a thermosetting resin and a small amount of photosensitive curable resin were used for green filters as first color filters, a high pigment concentration was achieved in the solid content, and thus color filters were formed with a small thickness. Thus, due to the small depth from the microlenses to the semiconductor substrate below, due to the green filters being formed with good rectangularity, and due to provision of a barrier structure between the color filters, the solid-state imaging device could reduce color mixing and had good sensitivity.

Furthermore, since the color filter material of the first color filters, which were green filters, was internally cured by heating, and externally cured by exposure using a small amount of photosensitive resin, solvent resistance was improved. Green filter materials having a high content of pigment, when used for such a device, may react with a solvent or other color filter materials and may change spectral characteristics. Thus, combination of thermal curing with photocuring as described above can improve hardness and exerts an effect of reducing or preventing change of spectral characteristics.

Example 2

A sample of Example 2 was prepared as in Example 1 except that a barrier layer was not firstly formed on a semiconductor substrate. In Example 1, the etching mask used when dry-etching portions where color filters are to be formed had an opening size 0.9 µm×0.9 µm. In Example 2, this size was 1.0 µm×1.0 µm.

<Conventional Method>

Based on the conventional method described in PTL 1, color filters of respective colors were formed by photolithographic patterning. This will be described in detail in the following.

First, using a material similar to that of the planarizing overlayer 13 of Example 1, a planarizing underlayer was formed with a thickness of 60 nm on a semiconductor substrate 10, followed by heating and curing at 230° C.

Then, layers respectively corresponding to three colors of green, blue and red were formed with a thickness of 700 nm by photolithography as when forming the blue and red layers in Example 1.

After that, microlenses were formed as in Example 1.

Through these processes, a solid-state imaging device based on a conventional method was prepared.

Specifically, the solid-state imaging device formed by the conventional method had a structure including green, blue and red color filters formed by photolithography without including a barrier layer 12 on the semiconductor substrate 10.

(Evaluation)

Samples with different barrier structures were prepared in the above examples.

Intensities of a red signal, a green signal, and a blue signal of the solid-state imaging devices of the respective examples were evaluated by comparing them with intensities of a red signal, a green signal, and a blue signal of the solid-state imaging device produced by photolithography of the conventional art with a structure in which spectral characteristics were adjusted for each of the layers for three colors, i.e., green, blue and red, each having a thickness 700 nm.

Table 1 below shows evaluations of the respective colors for intensities of signals. The results are shown in terms of ratios relative to 100% signal intensity of the solid-state imaging device of the conventional art.

TABLE 1

| | Detected signal intensity ratio (%) | | |
|---|---|---|---|
| | Red | Green | Blue |
| Conventional ratio | 100% | 100% | 100% |
| Example 1 | 107% | 109% | 108% |
| Example 2 | 108% | 107% | 105% |

As shown in Table 1, in the solid-state imaging devices of Examples 1 and 2 each formed by dry etching to form a barrier structure between the color filters and to form green filters with a small thickness and good rectangularity, the intensities of the signals of the respective colors were increased compared with the solid-state imaging device formed by photolithography of conventional art.

Further, since the production method of Example 2 did not include forming metal-containing barrier layers, sensitivity of the device was observed to be impaired due to color mixing, compared to Example 1. However, advantageously, the absence of the metal barrier structure could reduce the width of each barrier portion accordingly and increase the size of each color filter. As a result, the red color filters with a high refractive index showed a high signal intensity. The green and blue in Example 2 showed significantly higher signal intensities, although somewhat lower than Example 1, compared to the existing lithographic structures.

As can be seen from these results, the presence of a barrier structure could also increase the signal intensities of blue and red filters having larger thickness than those formed by the existing method of lithography.

The present invention has been described by way of some embodiments. However, the scope of the present invention should not be limited to the exemplary embodiments shown in the drawings and in the specification above, but should encompass all the embodiments that exert the effects equivalent to those exerted by the present invention. Further, the scope of the present invention is not limited to combinations of features of the invention defined by the claims but should be defined by any desired combination of specific features among all the disclosed features.

(Reference Techniques)

Techniques related to a solid-state imaging device and a method of producing a solid-state imaging device according to the present invention will be briefly described.

Solid-state imaging devices, such as CCDs (charge coupled devices) and CMOSs (complementary metal oxide semiconductors) mounted to digital cameras or the like, are progressing recently so as to achieve high pixel density and miniaturization. Among pixels of these devices, particularly minute pixels have a size smaller than 1.4 µm×1.4 µm.

Solid-state imaging devices are designed to produce colors using photoelectric conversion elements and color filter patterns respectively paired with them. Such a solid-state imaging device has regions (openings) in which the photoelectric conversion elements contribute to photoelectric conversion. These regions (openings) depend on the size and the number of pixels of the solid-state imaging device. The openings are limited to about 20% to 50% of the total area of the solid-state imaging device. Since smaller openings directly lead to lower sensitivity of the photoelectric conversion elements, such a solid-state imaging device generally includes microlenses for focusing light on the photoelectric conversion elements to compensate for the lower sensitivity.

Recently, there have been developed image sensors using a backside-illumination technique with which the area of the openings of the photoelectric conversion elements is increased to 50% or more of the total area of the solid-state imaging device. In this case, however, light leaking from a color filter may enter an adjacent color filter. Therefore, microlenses each having an appropriate size and shape are required to be formed.

As a method of forming such color filter patterns on a solid-state imaging device, photolithography is usually used as disclosed in PTL 1.

Further, as another method, PTL 2 discloses a method of forming all the color filter patterns by dry etching.

Recently, there is an increasing need of high-definition CCD imaging devices having more than 8,000,000 pixels, entailing an increasing need of such imaging devices having color filter patterns conforming to a pixel size of less than 1.4 µm×1.4 µm. However, a smaller pixel size leads to insufficient resolution of color filter patterns formed by photolithography, and this may adversely affect characteristics of the solid-state imaging device. For example, in a solid-state imaging device having pixels with a size of 1.4 µm or less, more specifically, around 1.1 µm or 0.9 µm, insufficient resolution may result in color unevenness due to configuration failure of patterns.

A smaller pixel size in color filter patterns leads to a larger aspect ratio (thickness of the color filter pattern increases relative to width thereof). When such color filter patterns are formed by photolithography, portions that should have originally been removed (ineffective portions of pixels) may remain as residues without being completely removed and may adversely affect pixels of other colors. When measures such as extension of development time are taken to remove the residues, pixels which have been cured and are necessary may also be separated.

If satisfactory spectral characteristics are to be obtained, the color filters need to have a larger thickness. However, when the color filters have a larger thickness while pixels are more and more finely configured, corners of the color filter patterns become rounded, for example, and the resolution tends to be lowered. When the thickness of the color filter patterns is made smaller in an attempt to obtain desired spectral characteristics, the pigment concentration needs to be increased in the color filter pattern material. However, when the pigment concentration is increased, light that is necessary for a photocuring reaction may not reach the bottom of the color filter pattern layer, and this may lead to insufficient curing of the color filter layer. Consequently, the color filter layer may be separated when developed in photolithography, entailing pixel defects.

Color filters may be made thinner and pigment concentration in the color filter material may be increased to obtain desired spectral characteristics. However, this may relatively reduce the amount of the photocurable component. Accordingly, photocuring of the color filter layer will be insufficient, easily causing configuration deterioration, uneven in-plane configuration, configuration deformation, or the like. Further, when exposure at the time of curing is increased to sufficiently photocure the color filter layer, productivity may be reduced.

Due to highly defined color filter patterns, the thickness of the color filter patterns not only may raise an issue associated with the production processes, but also may adversely affect the characteristics as solid-state imaging devices. When the color filter patterns have a large thickness, obliquely incident light may be dispersed by specific color filters, and then may enter into color filter patterns and photoelectric conversion elements of another color adjacent thereto. In this case, color mixing may occur. Color mixing may become more pronounced as the pixel size of the color filter patterns is made smaller and as the aspect ratio of the pixel size and the film thickness becomes larger. Color mixing due to incident light may also become pronounced when a distance between the color filter patterns and the photoelectric conversion elements increases due to formation of a planarizing layer or the like on the substrate in which the photoelectric conversion elements are formed. Thus, it is important to reduce the thickness of the color filter patterns or the planarizing layer formed under these patterns.

In a known method of preventing color mixing due to entry of light from an oblique direction, barriers are formed between the color filters of respective colors to reflect or refract light so that light incident on other pixels is blocked. Color filters for optical display devices, such as liquid crystal displays, use generally known barriers of a black matrix structure (BM) made of a black material. However, solid-state imaging devices include color filter patterns with a size of several micrometers or less. Therefore, if barriers are formed by a generally used method of forming a black matrix, the pixels may be partially filled with BM, possibly causing pixel defects and resolution lowering, because pattern size is large.

In the case of solid-state imaging devices of advanced high definition, the barriers need to have a size of several hundred nanometers, more preferably, a width of about 200 nm or less. That is, high definition of pixels has already advanced to such an extent that the pixel size is about 1 µm. Therefore, if the barriers are to be imparted with a light-blocking effect of reducing or preventing color mixing, the thickness may preferably be 100 nm or less. It is difficult to form barriers of this size by photolithography using BM. Therefore, for example, the barriers may be formed by forming a film of a metal such as aluminum, tungsten, or titanium; an inorganic substance such as $SiO_2$, or a combination of these materials by vapor deposition, CVD, sputtering, or the like, and then etching the film into a lattice pattern.

When a solid-state imaging device has a barrier structure formed by such a method, it is difficult to form color filters with a good configuration in the barrier structure by dry etching as described in PTL 2, or the barrier structure itself may be dry-etched.

Thus, to increase the number of pixels in a solid-state imaging device, color filter patterns are required to have a higher definition, and it is important to make the color filter patterns thin and prevent color mixing.

As described above, advancement of size reduction necessitates thickness reduction of color filter patterns which are formed by photolithography by imparting photosensitivity to color filter materials of conventional art. In this case, the ratio of the pigment component contained in the color filter material is increased, and thus the color filter material unavoidably contains an insufficient amount of photosensitive component. Therefore, no resolution performance is obtained, residues are more likely to remain, and pixels are more likely to be separated. Thus, characteristics of the solid-state imaging device are deteriorated.

As measures against this, therefore, the technique of PTL 2 has been proposed to achieve finer and thinner color filter patterns. In PTL 2, to increase a pigment concentration in a color filter material, color filter patterns are formed by dry etching that enables patterning of a material containing no photosensitive component. The techniques of using dry etching can increase a pigment concentration, and can produce color filter patterns that achieve sufficient spectral characteristics even when the thickness of the color filter patterns is reduced.

The inventor has reviewed the production method described in PTL 2 and found that, when forming color filter patterns by dry etching, shaping is difficult and residues are likely to be left because the material for forming the color filters (color filter material) contains organic substances and metal, and that, when a material is to be dry-etched with high shape definition leaving no residues, the etching tends to damage the photoelectric conversion elements.

The present invention has an aspect to provide a high-definition solid-state imaging device which has good sensitivity and is less likely to cause color mixing, and also providing a method of producing the same.

A solid-state imaging device in an aspect of the present invention includes a semiconductor substrate provided with a plurality of two-dimensionally arranged photoelectric conversion elements, and color filter patterns provided on the semiconductor substrate such that color filters for a plurality of colors are respectively arranged for the photoelectric conversion elements. The device is characterized in that the device is provided with a first visible-light transmissive layer formed between the semiconductor substrate and the color filter patterns, and second visible-light transmissive layers each formed between adjacent color filters, the first invisible-light transmissive layer being continuous with the second visible-light transmissive layers; the first visible-light transmissive layer and the second visible-light transmissive layers are made of the same material; of the color filters for a plurality of colors, the color filters having a largest area each have an edge that is continuous with an edge portion of a corresponding one of the second visible-light transmissive layers; and the color filters having a largest area have side walls over which reaction product layers containing a component configuring the first visible-light transmissive layer are respectively formed.

A method of producing a solid-state imaging device in an aspect of the present invention, the device being provided with a semiconductor substrate including a plurality of two-dimensionally arranged photoelectric conversion elements, color filter patterns provided on the semiconductor substrate such that color filters for a plurality of colors are respectively arranged for the photoelectric conversion elements, and visible-light transmissive layers formed between the color filters and under the color filters, is characterized in that the method includes: forming a visible-light transmissive layer on the entire surface of the semiconductor substrate including the two-dimensionally arranged photoelectric conversion elements; patterning the visible-light transmissive layer by dry etching to form openings at positions where first-color color filter patterns among the plurality of color filter patterns are to be formed; applying a first-color color filter material to the visible-light transmissive layer to fill the openings with the first-color color filter material and curing the first-color color filter material to form first color filter patterns of first color filters; dry-etching the visible-light transmissive layer and the first-color color filters thereon to provide openings where patterns of other color filters are to be formed; and forming the other color filters by photolithographic patterning.

According to an aspect of the present invention, a high-definition solid-state imaging device having good sensitivity, and which is less likely to cause color mixing, and a method of producing the same, can be provided.

For example, according to an aspect of the present invention, color filters of the first color can be formed by only dry-etching a visible-light transmissive layer which is easily shapeable by dry etching, and applying thereto a material of the color filters of the first color, followed by curing. Thus, the thickness of the color filters of the first color can be easily reduced, and the color filters of the first color can be formed with good rectangularity. Thus, since the total depth from the top of the microlenses to the devices can be reduced, color mixing can be reduced, and a high-definition solid-state imaging device with high sensitivity can be obtained.

REFERENCE SIGNS LIST

10 . . . Semiconductor substrate
11 . . . Photoelectric conversion element
12 . . . Barrier layer
13 . . . Planarizing overlayer
14 . . . First color filter
15 . . . Second color filter
16 . . . Third color filter
18 . . . Microlens
20 . . . Etching mask (photosensitive resin layer)
20a . . . Photosensitive resin mask layer
20b . . . Opening
30 . . . Metal-containing lattice barrier layer
40 . . . Reaction product layer produced by dry etching barrier layer Obviously, numerous modifications and variations of the present invention are possible in light of the above teachings. It is therefore to be understood that within the scope of the appended claims, the invention may be practiced otherwise than as specifically described herein.

What is claimed is:

1. A solid-state imaging device, comprising:
a semiconductor substrate including a plurality of two-dimensionally positioned photoelectric conversion elements, and having a plurality of color filters of a plurality of colors formed on the semiconductor substrate and positioned in correspondence to the photoelectric conversion elements;
a first visible-light transmissive layer formed between the semiconductor substrate and the color filters; and
a plurality of second visible-light transmissive layers each formed between adjacent color filters, the second visible-light transmissive layers comprising a same material as the first visible-light transmissive layer and being continuous with the first visible-light transmissive layer,
wherein color filters having a largest area among the color filters of the plurality of colors each have an edge portion being continuous with an edge portion of a corresponding one of the second visible-light transmissive layers, and
the color filters having the largest area each have a side wall on which a reaction product layer including a material forming the first visible-light transmissive layer is formed.

2. The solid-state imaging device according to claim 1, wherein the second visible-light transmissive layers include metal-containing layers which are formed in a lattice form surrounding each of the photoelectric conversion elements in a plan view.

3. The solid-state imaging device according to claim 1, wherein the second visible-light transmissive layers each have a height which is lower than a height of the color filters of the plurality of colors, and the color filters having the largest area cover the second visible-light transmissive layers.

4. The solid-state imaging device according to claim 2, wherein the second visible-light transmissive layers each have a height which is lower than a height of the color filters of the plurality of colors, and the color filters having the largest area cover the second visible-light transmissive layers.

5. The solid-state imaging device according to claim 1, wherein the color filters having the largest area comprise a resin including at least one of a thermosetting component and a photocurable component.

6. The solid-state imaging device according to claim 2, wherein the color filters having the largest area comprise a resin including at least one of a thermosetting component and a photocurable component.

7. The solid-state imaging device according to claim 3, wherein the color filters having the largest area comprise a resin including at least one of a thermosetting component and a photocurable component.

8. The solid-state imaging device according to claim 1, wherein the color filters having the largest area include a colorant at a concentration of 50 mass % or more.

9. The solid-state imaging device according to claim 2, wherein the color filters having the largest area include a colorant at a concentration of 50 mass % or more.

10. The solid-state imaging device according to claim 3, wherein the color filters having the largest area include a colorant at a concentration of 50 mass % or more.

11. The solid-state imaging device according to claim 5, wherein the color filters having the largest area include a colorant at a concentration of 50 mass % or more.

12. The solid-state imaging device according to claim 1, wherein color filters having a largest curvature among the color filters of the plurality of colors are first-color color filters.

13. The solid-state imaging device according to claim 12, wherein the first-color color filters are green filters.

14. The solid-state imaging device according to claim 13, wherein color filters other than the first-color color filters include blue filters, red filters, IR cut filters, or high-refractive-index filters transparent to visible light.

15. A method of producing a solid-state imaging device, comprising:

forming a visible-light transmissive layer on a semiconductor substrate which includes a plurality of two-dimensionally positioned photoelectric conversion elements, and has a plurality of color filters of a plurality of colors formed on the semiconductor substrate and positioned in correspondence to the photoelectric conversion elements;

dry etching the visible-light transmissive layer such that the visible-light transmissive layer is patterned with openings formed at positions where first-color color filters among the color filters are to be formed;

applying a first-color color filter material to the visible-light transmissive layer such that the openings are filled with the first-color color filter material;

curing the first-color color filter material such that first-color color filters are formed on the visible-light transmissive layer;

dry etching the visible-light transmissive layer and the first-color color filters such that openings are formed at positions where other color filters are to be formed; and forming the other color filters by photolithographic patterning.

16. The method according to claim 15, further comprising:

forming a plurality of metal-containing barriers in a lattice form at positions in correspondence to the photoelectric conversion elements, wherein the visible-light transmissive layer is formed after the metal-containing barriers are formed, and the visible-light transmissive layer covers the metal-containing barriers.

17. The method according to claim 15, wherein the first-color color filters are green filters, and the other color filters include blue filters, red filters, IR cut filters, or high-refractive-index filters transparent to visible light.

18. The method according to claim 16, wherein the first-color color filters are green filters, and the other color filters include blue filters, red filters, IR cut filters, or high-refractive-index filters transparent to visible light.

19. The method according to claim 15, wherein the first-color color filters are color filters having a largest curvature radius among the color filters of the plurality of colors.

20. The method according to claim 19, wherein the first-color color filters are green filters.

* * * * *